US011024710B2

(12) United States Patent
Robinson et al.

(10) Patent No.: US 11,024,710 B2
(45) Date of Patent: Jun. 1, 2021

(54) VERTICALLY ORIENTED PLANAR STRUCTURES OF TRANSITION METAL CHALCOGENIDES FOR ADVANCED ELECTRONIC AND OPTOELECTRONIC SYSTEMS

(71) Applicant: The Penn State Research Foundation, University Park, PA (US)

(72) Inventors: Joshua Alexander Robinson, Spring Mills, PA (US); Rafael Vila, Sierra Vista, AZ (US)

(73) Assignee: The Penn State Research Foundation, University Park, PA (US)

( * ) Notice: Subject to any disclaimer, the term of this patent is extended or adjusted under 35 U.S.C. 154(b) by 0 days.

(21) Appl. No.: 15/712,561

(22) Filed: Sep. 22, 2017

(65) Prior Publication Data
US 2018/0090309 A1     Mar. 29, 2018

Related U.S. Application Data

(60) Provisional application No. 62/398,751, filed on Sep. 23, 2016.

(51) Int. Cl.
| | |
|---|---|
| *H01L 29/06* | (2006.01) |
| *H01L 21/02* | (2006.01) |
| *H01L 29/24* | (2006.01) |
| *H01L 29/04* | (2006.01) |
| *H01L 29/78* | (2006.01) |

(Continued)

(52) U.S. Cl.
CPC ...... *H01L 29/0665* (2013.01); *H01L 21/0242* (2013.01); *H01L 21/0259* (2013.01); *H01L 21/02376* (2013.01); *H01L 21/02378* (2013.01); *H01L 21/02381* (2013.01); *H01L 21/02565* (2013.01); *H01L 21/02568* (2013.01); *H01L 21/02612* (2013.01); *H01L 29/045* (2013.01); *H01L 29/0669* (2013.01); *H01L 29/24* (2013.01); *H01L 21/02664* (2013.01);

(Continued)

(58) Field of Classification Search
CPC ........... H01L 21/0259; H01L 21/02568; H01L 21/02565; H01L 21/0242; H01L 21/02378; H01L 21/02381; H01L 21/02376; H01L 29/0665

See application file for complete search history.

(56) References Cited

U.S. PATENT DOCUMENTS

| 9,620,665 B1* | 4/2017 | Bartolucci | ............ H01L 31/18 |
| 2010/0156272 A1* | 6/2010 | Kim | ................. H01J 31/127 |
| | | | 313/495 |

(Continued)

OTHER PUBLICATIONS

Shi, Y. et al., "Recent advances in controlled synthesis of two-dimensional transition metal dichalcogenides via vapour deposition techniques," Chem. Soc. Rev. 2015, 44, 2744. (Year: 2014).*

(Continued)

*Primary Examiner* — Michael Jung
(74) *Attorney, Agent, or Firm* — Riverside Law LLP

(57) ABSTRACT

The present invention relates to methods for fabricating vertical homogenous and heterogeneous two-dimensional structures, the fabricated vertical two-dimensional structures, and methods of using the same. The methods demonstrated herein produce structures that are free standing and electrically isolated.

15 Claims, 24 Drawing Sheets

(51) Int. Cl.
   *H01L 29/66* (2006.01)
   *H01L 29/778* (2006.01)

(52) U.S. Cl.
   CPC ...... *H01L 29/66795* (2013.01); *H01L 29/778* (2013.01); *H01L 29/785* (2013.01)

(56) References Cited

U.S. PATENT DOCUMENTS

2014/0353166 A1    12/2014  Iezzi et al.
2017/0051400 A1*    2/2017  Choi ................. C23C 16/06

OTHER PUBLICATIONS

Balendhran et al., "Atomically thin layers of MoS2 via a two step thermal evaporation-exfoliation method", Nanoscale, 2012, 4(2):461-466.
Mann et al., "Facile growth of monolayer MoS2 film areas on SiO2", Eur Phys J B, 2013, 86:226.
Senthilkumar et al., "Direct vapor phase growth process and robust photoluminescence properties of large area MoS2 layer", Nano Res, 2014, 7(12):1759-1768.
Ganorkar et al., "Effect of precursor on growth and morphology of MoS2 monolayer and multilayer", Journal of Physics and Chemistry of Solids, 2015, 87:32-37.
Kong et al., "Synthesis of MoS2 and MoSe2 Films with Vertically Aligned Layers", Nano Lett, 2013, 13:1341-1347.
Li et al. "Synthesis and characterization of vertically standing MoS2 nanosheets", Scientific Reports, 2016, 6:21171.
Lan et al., "Synthesis of Vertically Standing MoS2 Triangles on SiC", Sci. Rep., 2016, 6:31980.

\* cited by examiner

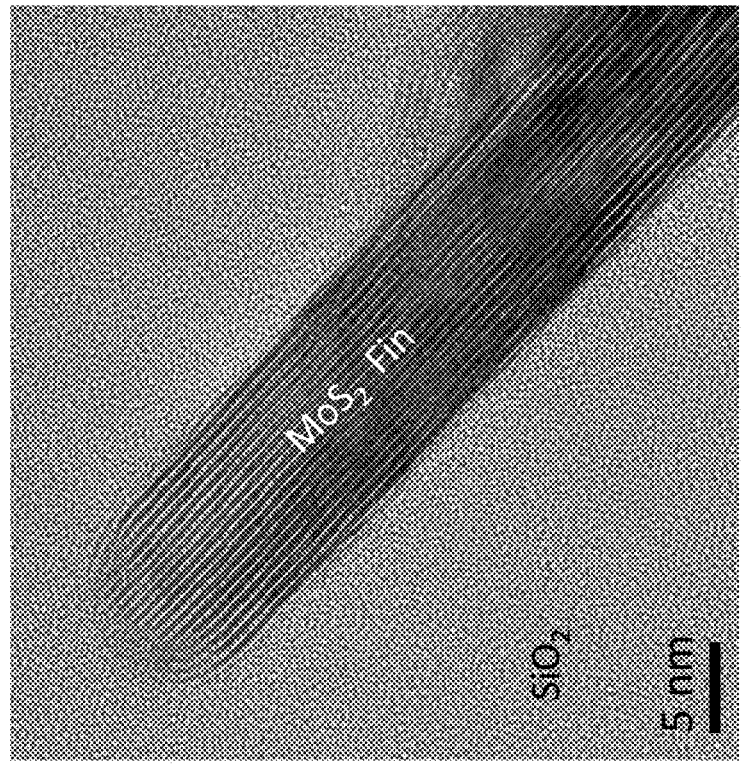
Figure 10B
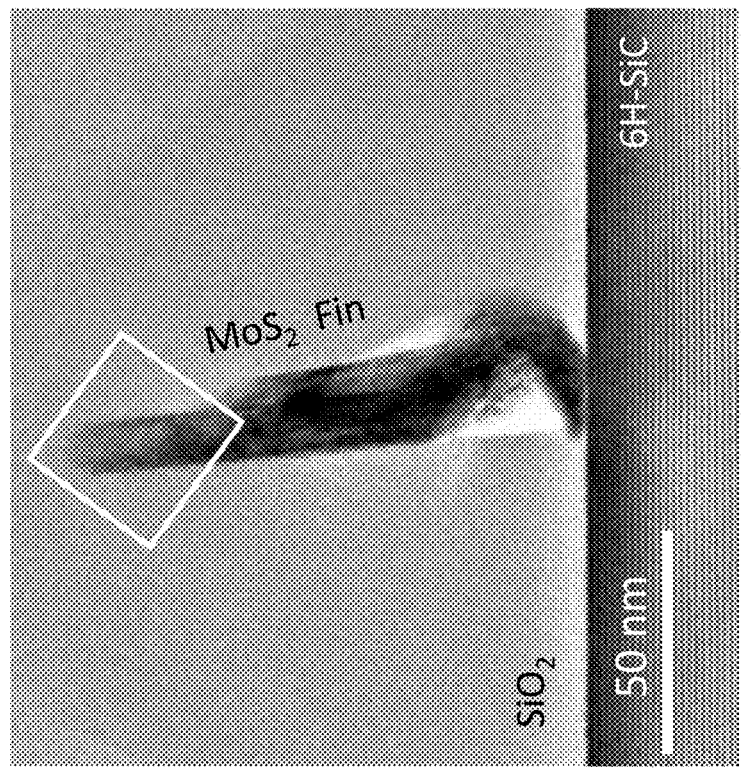
Figure 10A
Figure 10A – Figure 10B

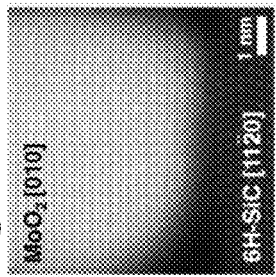
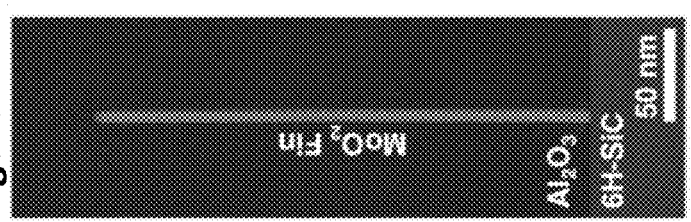
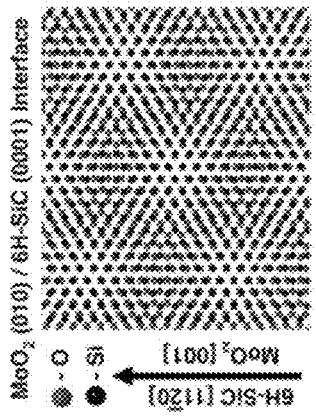
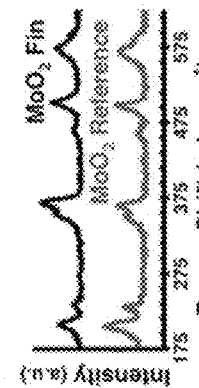
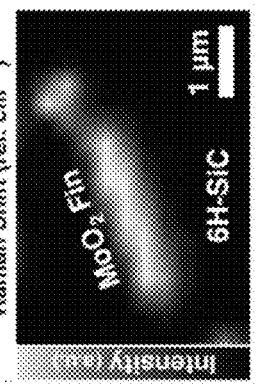
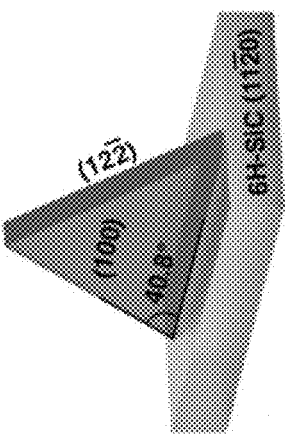
Figure 14A – Figure 14H

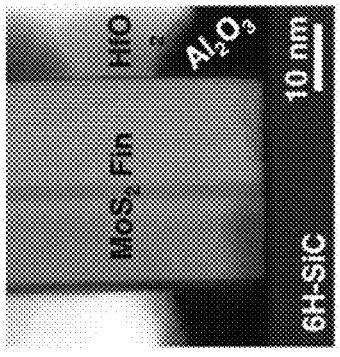
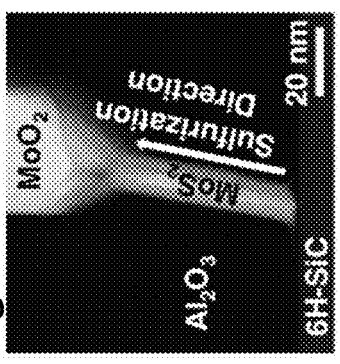
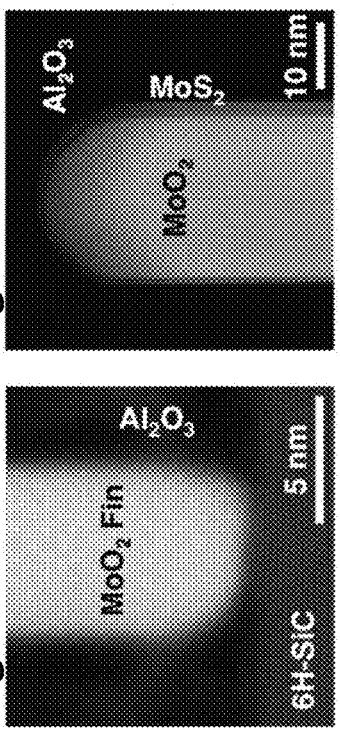
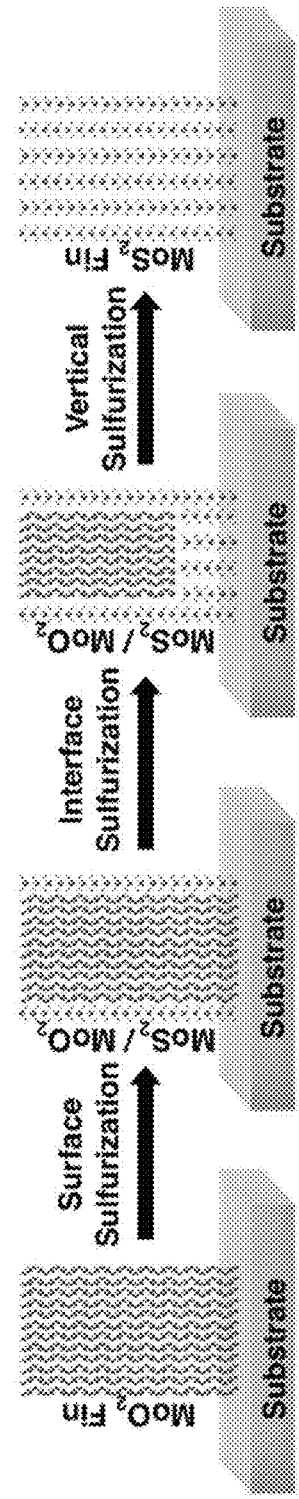
Figure 15A – Figure 15E

Figure 20A
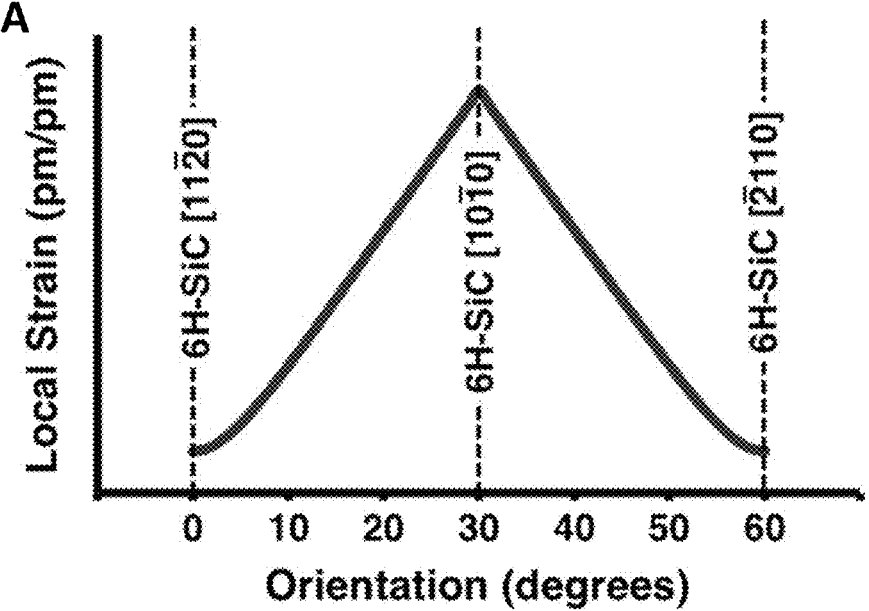
Figure 20B
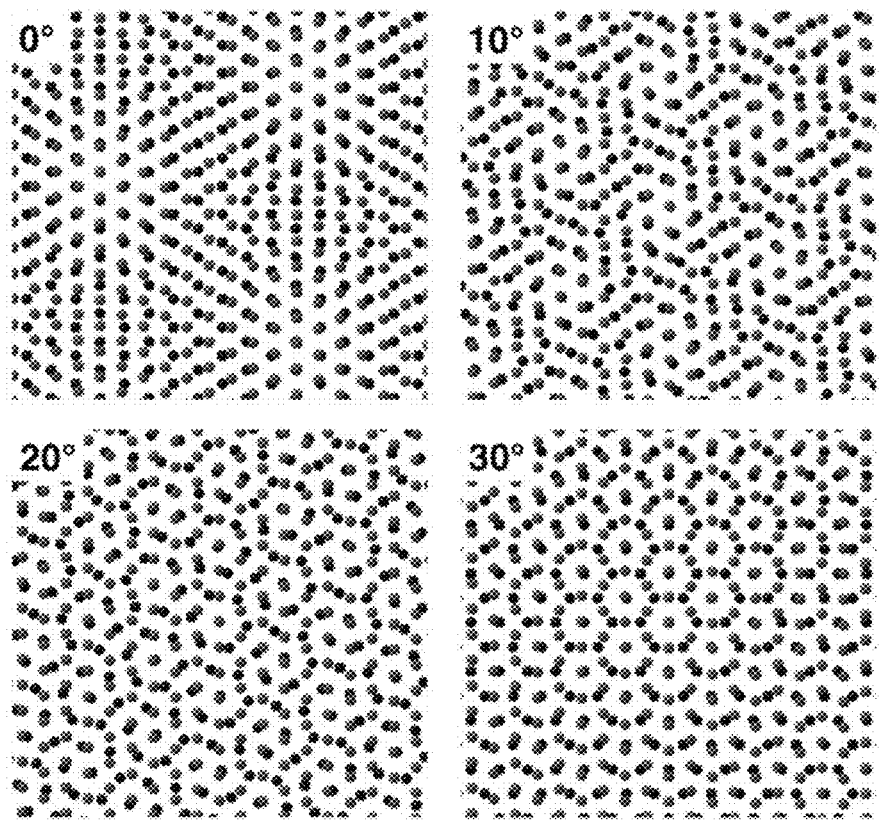
Figure 20A – Figure 20B

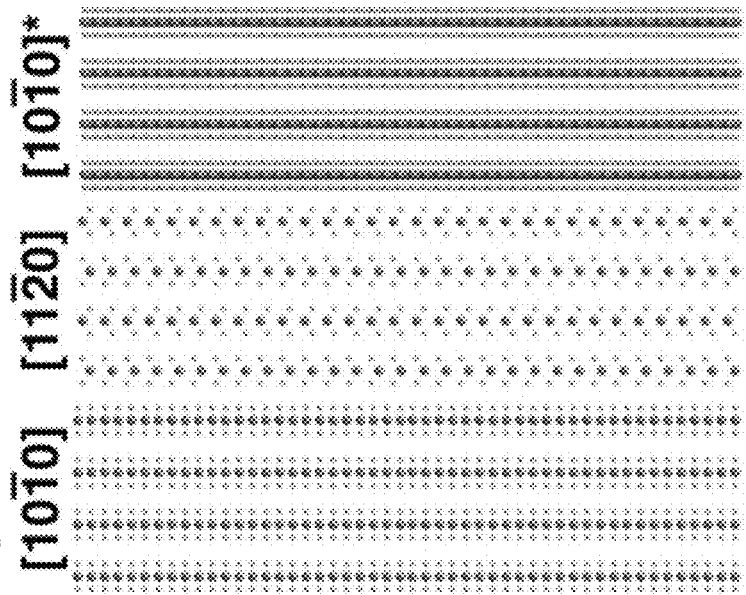
Figure 24B
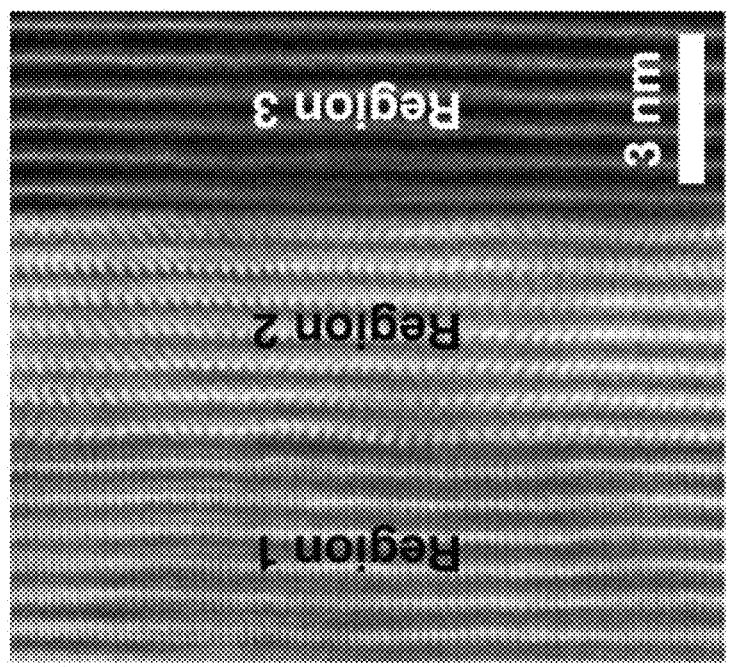
Figure 24A
Figure 24A – Figure 24B

VERTICALLY ORIENTED PLANAR STRUCTURES OF TRANSITION METAL CHALCOGENIDES FOR ADVANCED ELECTRONIC AND OPTOELECTRONIC SYSTEMS

CROSS-REFERENCE TO RELATED APPLICATIONS

This application is a non-provisional of U.S. Provisional Patent Application Ser. No. 62/398,751, filed Sep. 23, 2016, the entire content of which is incorporated herein by reference.

STATEMENT REGARDING FEDERALLY SPONSORED RESEARCH OR DEVELOPMENT

This invention was made with government support under NSF Grant No. 1453924, awarded by the National Science Foundation. The Government has certain rights in the invention.

BACKGROUND OF THE INVENTION

Semiconducting two-dimensional (2D) materials such as molybdenum disulfide ($MoS_2$) are of interest for their potential applications in digital electronics, catalytic reactions, optoelectronics, and energy storage (Jariwala D et al., ACS Nano, 2014, 8:1102-20; Zhao Y et al., Sci. Technol. Adv. Mater. 2013, 14:043501; Lopez-Sanchez O et al., Nat. Nanotechnol., 2013, 8:497-501; Wang Q H et al., Nat. Nanotechnol., 2012, 7:699-712). The 'traditional' route to synthesizing such materials is powder vaporization (PV) (often referred to as chemical vapor deposition) (Wang Q H et al., Nat. Nanotechnol., 2012, 7:699-712; Lee Y H et al., Adv. Mater., 2012, 24:2320-5; Wang X et al., J. Am. Chem. Soc., 2013, 135:5304-7; Bhimanapati G R et al., ACS Nano, 2015 9:11509-39; Lv R et al., Acc. Chem. Res., 2014, 48:56-64; Wang S et al., Chem. Mater., 2014, 26:6371-9), where the equilibrium morphology is a strong function of the metal:chalcogen ratio (Mo:S for $MoS_2$) (Wang S et al., Chem. Mater., 2014, 26:6371-9; Cao D et al., J. Phys. Chem. C, 2015, 119:4294-301). PV synthesis of $MoS_2$ can yield vertical $MoS_2$ structures (Zhou G et al., Cryst. Eng. Com., 2014, 16:9025-32; Dumcenco D et al., 2D Mater., 2015, 2:044005), however, these structures are often ignored when the morphology evolution of $MoS_2$ is discussed (Wang S et al., Chem. Mater., 2014, 26:6371-9; Cao D et al., J. Phys. Chem. C, 2015, 119:4294-301), thereby completely omitting a major part of the Mo:S ratio impact on morphology in this deposition technique. Vertically grown $MoS_2$ exhibits enhanced catalytic activity at exposed edge sites (Kibsgaard J et al., Nat. Mater., 2012, 11:963-9; Kong et al., Nano Lett., 2013, 13:1341-7; Kong D et al., Nano Lett., 2013, 13:1341-7; Jung Y et al., Nano Lett., 2014, 14:6842-9; Zhou W et al., Small, 2013, 9:140-7; Yan Y et al., ACS Appl. Mater. Interfaces, 2013, 5:12794-8; Ling L et al., RSC Adv., 2016, 6:18483-9; Karunadasa H I et al., Science, 2012, 335:698-702); therefore, understanding and controlling the synthesis of vertical $MoS_2$ is crucial. Furthermore, a fundamental understanding of the thermodynamics and kinetics governing the reaction, nucleation, and growth of $MoS_2$ from horizontal to vertical is vital for engineering layered material systems for the entire spectrum of applications.

Two dimensional materials have the potential to outperform traditional semiconductors, but current materials and device designs cannot meet their predicted performance (FIG. 1). This is the result of a variety of factors, including substrate impact and device design (Ma N et al., Phys Rev X, 2014, 4:011043; Hisamoto D et al., International Electron Devices Meeting 1998 Technical Digest (Cat. No. 98CH36217) IEEE, 1998, pp. 1032-1034). As a result, if it is possible to remove the substrate effects and improve device electrostatics in 2D materials, the gap between theoretical performance and experimental reality will cease to exist, resulting in technology that outperforms even the more extreme scaling of silicon.

There is a need in the art for methods to fabricate isolated, vertical homogenous and heterogeneous two-dimensional structures. The present invention meets this need.

SUMMARY OF THE INVENTION

The present invention relates to methods for fabricating vertical homogenous and heterogeneous two-dimensional structures, the fabricated vertical two-dimensional structures, and methods of using the same. The methods demonstrated herein produce structures that are free standing and electrically isolated.

In one aspect, the invention relates to a method of fabricating vertical 2D structures from a first material. The method comprises the steps of: placing a substrate on a first crucible in a furnace; placing an amount of a first material powder in the first crucible underneath the substrate; introducing a flow of a gas into the furnace and maintaining a furnace pressure of between 1 and 1000 torr; heating the furnace to at least one temperature between 500 and 1000° C. and holding for at least one period of time between 5 and 120 minutes; and equilibrating the furnace temperature to room temperature; wherein at least one planar structure is generated on the substrate such that the at least one planar structure is substantially perpendicular to the substrate surface.

In one embodiment, the method further comprises the steps of: placing an amount of a second material powder in a second crucible upstream from the first crucible; introducing a flow of a gas into the furnace and maintaining a furnace pressure of between 1 and 1000 torr; heating the furnace to at least one temperature between 500 and 1000° C. and holding for at least one period of time between 5 and 120 minutes; and equilibrating the furnace temperature to room temperature; wherein the second material powder is annealed to the at least one planar structure on the substrate.

In another aspect, the invention relates to a method of fabricating vertical 2D structures from a first material and a second material, comprising the steps of: placing a substrate on a first crucible in a furnace; placing an amount of a first material powder in the first crucible underneath the substrate; placing an amount of a second material powder in a second crucible upstream from the first crucible; introducing a flow of a gas into the furnace and maintaining a furnace pressure of between 1 and 1000 torr; heating the furnace to at least one temperature between 500 and 1000° C. and holding for at least one period of time between 5 and 120 minutes; and equilibrating the furnace temperature to room temperature; wherein at least one planar structure is generated on the substrate such that the at least one planar structure is substantially perpendicular to the substrate surface.

In one embodiment, the first material is a transition metal oxide. In one embodiment, the second material is a chalcogen. In one embodiment, the substrate is selected from the group consisting of: sapphire, silicon, silicon carbide, silicon dioxide, graphene, graphite, non-alkali glass, poly-silicon carbide, and poly-silicon. In one embodiment, the substrate is placed face down on the first crucible.

In one embodiment, the first crucible is an alumina crucible. In one embodiment, the second crucible is a quartz crucible. In one embodiment, the gas is an inert gas. In another embodiment, the gas is a reactive gas.

In one embodiment, the fabricated vertical 2D structures have a thickness of less than 20 nm. In one embodiment, the fabricated vertical 2D structures have less than 20 layers. In one embodiment, each layer is less than 1 nm thick. In one embodiment, the layers are parallel to each other. In one embodiment, the layers are separated by van der Waals gaps.

In one embodiment, the methods of the present invention further comprise the step of adding at least one additional material to the vertical 2D structures to form vertical 2D heterostructures.

In one aspect, the invention relates to a method of fabricating vertical 2D $MoO_2$ structures. The method comprises the steps of: placing a substrate on a first crucible in a furnace; placing 2 mg $MoO_3$ powder in the first crucible underneath the substrate; introducing a flow of about 400 sccm argon gas into the furnace and maintaining a furnace pressure of about 710 torr; heating the furnace to about 300° C. at about 50° C./minute and holding for 10 minutes; heating the furnace to about 700° C. at about 50° C./minute and holding for 10 minutes; cooling the furnace to about 550° C. at about 50° C./minute; and equilibrating the furnace temperature to room temperature; wherein at least one planar structure is generated on the substrate such that the at least one planar structure is substantially perpendicular to the substrate surface.

In one embodiment, the method further comprises the steps of: placing 700 mg sulfur powder in a second crucible upstream from the first crucible; heating the furnace region containing the second crucible to about 200° C.; introducing a flow of about 400 sccm argon gas into the furnace and maintaining a furnace pressure of about 710 torr; heating the furnace region containing the first crucible to about 700° C. at about 50° C./minute and holding for 10 minutes; and equilibrating the furnace temperature to room temperature; wherein the sulfur powder is annealed to the at least one planar structure on the substrate.

In another aspect, the invention relates to a method of fabricating vertical 2D $MoS_2$ structures. The method comprises the steps of: placing a substrate on a first crucible in a furnace; placing 2 mg $MoO_3$ powder in the first crucible underneath the substrate; placing 700 mg sulfur powder in a second crucible upstream from the first crucible; introducing a flow of about 400 sccm argon gas into the furnace and maintaining a furnace pressure of about 710 torr; heating the furnace to about 300° C. at about 50° C./minute and holding for 10 minutes; heating the furnace to about 700° C. at about 50° C./minute and holding for 10 minutes; cooling the furnace to about 550° C. at about 50° C./minute; and equilibrating the furnace temperature to room temperature; wherein at least one planar structure is generated on the substrate such that the at least one planar structure is substantially perpendicular to the substrate surface.

BRIEF DESCRIPTION OF THE DRAWINGS

The following detailed description of preferred embodiments of the invention will be better understood when read in conjunction with the appended drawings. For the purpose of illustrating the invention, there are shown in the drawings embodiments which are presently preferred. It should be understood, however, that the invention is not limited to the precise arrangements and instrumentalities of the embodiments shown in the drawings.

FIG. 10A and FIG. 10B depict magnified TEM images of a $MoS_2$ fin, wherein the layered structure and van der Waals gaps between the layers of the fin are visible.

(FIG. 12A) Concentration of $MoO_3$ precursor at steady state, which is also an indication of partial pressure of $MoO_3$. (FIG. 12B) Vc in vicinity of the substrate colored by its component normal to the substrate. The simulation results are consistent with experiments as larger fins are observed where there is larger Vc normal to the substrate. (FIG. 12C) Concentration of $MoO_3$ precursor on the substrate numerical results (top) vs. experimental observations (bottom).

(FIG. 13A) Schematic illustration of the experimental set-up used during powder vaporization (PV) of $MoS_2$. (FIG. 13B through FIG. 13D) The SEM images of the resulting PV deposition showing a transition from vertical domains (FIG. 13B), to a mixture of vertical and horizontal domains (FIG. 13C), and finally only horizontal domains (FIG. 13D), as the partial pressure ratio of $MoO_x:S_2$ decreases. (FIG. 13E) Tilted SEM image of a vertical fin showing its isosceles triangular morphology. (FIG. 13F) Raman spectra collected from a vertical fin, plotted in blue, and horizontal domains, plotted in green.

FIG. 14A through FIG. 14H depict fin growth, morphology, and structure from the co-flow process. (FIG. 14A) SEM image of the deposition resulting from the $MoO_3$ only PV process. (FIG. 14B) Raman spectra of a vertical fin compared to a known reference of $MoO_2$. (FIG. 14C) Intensity mapping of the Raman shift (497 cm$^{-1}$) of a vertical fin. (FIG. 14D) Low-magnification HAADF-STEM image of a $MoO_2$ fin. (FIG. 14E) High-magnification HAADF-STEM image of the interface between $MoO_2$ and 6H—SiC. (FIG. 14F) High-magnification HAADF-STEM image of the center of the $MoO_2$ fin. (FIG. 14G) Schematic of the observed $MoO_2$ fin morphology relative to exposed crystallographic planes. (FIG. 14H) Modeled interface of oxygen terminated $MoO_2$ (001) and silicon terminated 6H—SiC (0001).

FIG. 15A through FIG. 15D depict the HAADF-STEM images of vertical fins at various points during sulfurization: (FIG. 15A) 0 minutes, (FIG. 15B) 15 minutes, (FIG. 15C) 1 hour, and (FIG. 15D) 72 hours.

FIG. 15E illustrates a schematic of the proposed sulfurization mechanism.

FIG. 20A and FIG. 20B depict the local strain interface. FIG. 20A illustrates local strain at the $MoO_2$ (001)/6H—SiC (0001) interface calculated by rotating the $MoO_2$ (001) plane about the 6H—SiC [0001] axis. FIG. 20B illustrates the evolution of the Moiré pattern under rotation from a minimum strain when $MoO_{2\,[001]}$ axis is parallel to the 6H—SiC [1120] direction (0° orientation) and a maximum when the $MoO_2$ [001] axis is parallel to the 6H—SiC [1010] direction (30° orientation). This is repeated every 60° and 180° due to the 6-fold symmetry and 2-fold symmetry from 6H—SiC and $MoO_2$ respectively.

FIG. 24A is a high magnification HAADF-STEM image of the $MoS_2$ fin from FIG. 15D showing $MoS_2$ layers with different contrast resulting from different orientations, the zone axis of Region 1, 2, and 3 are identified as [1010], [1120], and off-axis [1010] respectively.

FIG. 24B is a schematic illustration comparing atomic projections of $MoS_2$ as viewed down the [1010], [1120], and 1° off axis [1010]*$MoS_2$ zone axis.

DETAILED DESCRIPTION

Figure 1:
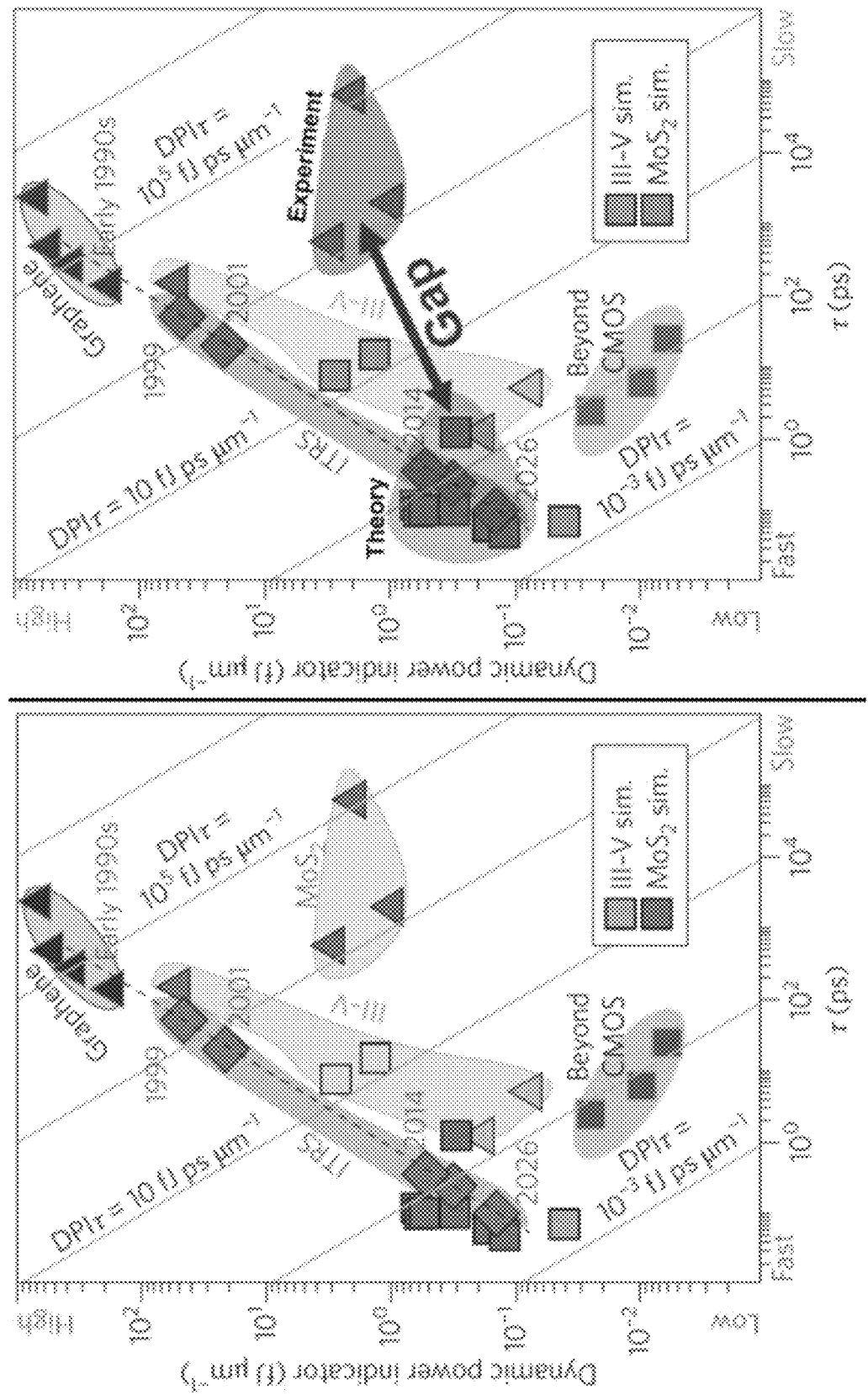
FIG. 1 depicts charts demonstrating the deficiency in actual performance and theoretical performance of existing two dimensional materials in the art.

The present invention relates to methods for fabricating vertical homogenous and heterogeneous two-dimensional structures, the fabricated vertical two-dimensional structures, and methods of using the same. The methods demonstrated herein produce structures that are free standing and electrically isolated. In certain embodiments, the structures are less than 20 nm thick, comprise less than 20 layers, with each layer being about 0.6 nm thick.

Definitions

It is to be understood that the figures and descriptions of the present invention have been simplified to illustrate elements that are relevant for a clear understanding of the present invention, while eliminating, for the purpose of clarity, many other elements typically found in the art. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein. The disclosure herein is directed to all such variations and modifications to such elements and methods known to those skilled in the art.

Unless defined elsewhere, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are described.

As used herein, each of the following terms has the meaning associated with it in this section.

The articles "a" and "an" are used herein to refer to one or to more than one (i.e., to at least one) of the grammatical object of the article. By way of example, "an element" means one element or more than one element.

"About" as used herein when referring to a measurable value such as an amount, a temporal duration, and the like, is meant to encompass variations of ±20%, ±10%, ±5%, ±1%, and ±0.1% from the specified value, as such variations are appropriate.

The term "chalcogens," as used herein, refers to chemical elements from the group 16 column of the periodic table, most notably sulfur (S), selenium (Se) and tellurium (Te). According to the present techniques, the chalcogen sources employed are preferably elemental chalcogens which do not contain unwanted impurities, such as carbon, oxygen and halogens.

Spatially relative terms, such as "beneath", "below", "lower", "underneath", "above", "upper", "upstream", "downstream", and the like, may be used herein for ease of description to describe one element or feature's relationship to another element(s) or feature(s) as illustrated in the figures. It will be understood that the spatially relative terms are intended to encompass different orientations of the components in use or operation in addition to the orientation depicted in the figures. For example, if a component in the figures is turned over, elements described as "below" or "beneath" other elements or features would then be oriented "above" the other elements or features. The terms "upstream" and "downstream" denote spatial orientation relative to a fluid stream, such as a liquid or a gas, wherein elements described as "upstream" are closer to the fluid source and elements described as "downstream" are further away from the fluid source.

Throughout this disclosure, various aspects of the invention can be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6, etc., as well as individual numbers within that range, for example, 1, 2, 2.7, 3, 4, 5, 5.3, 6, and any whole and partial increments there between. This applies regardless of the breadth of the range.

The present invention provides novel methods for fabricating unique vertical 2D structures. Unlike existing methods in the art, the methods demonstrated herein produce structures that are free standing and electrically isolated. The present invention also relates to the unique vertical 2D structures as well as to methods of using the same. In certain embodiments, the vertical 2D structures are less than 20 nm thick and comprise less than 20 layers, with each layer being about 0.6 nm thick.

Figure 2:
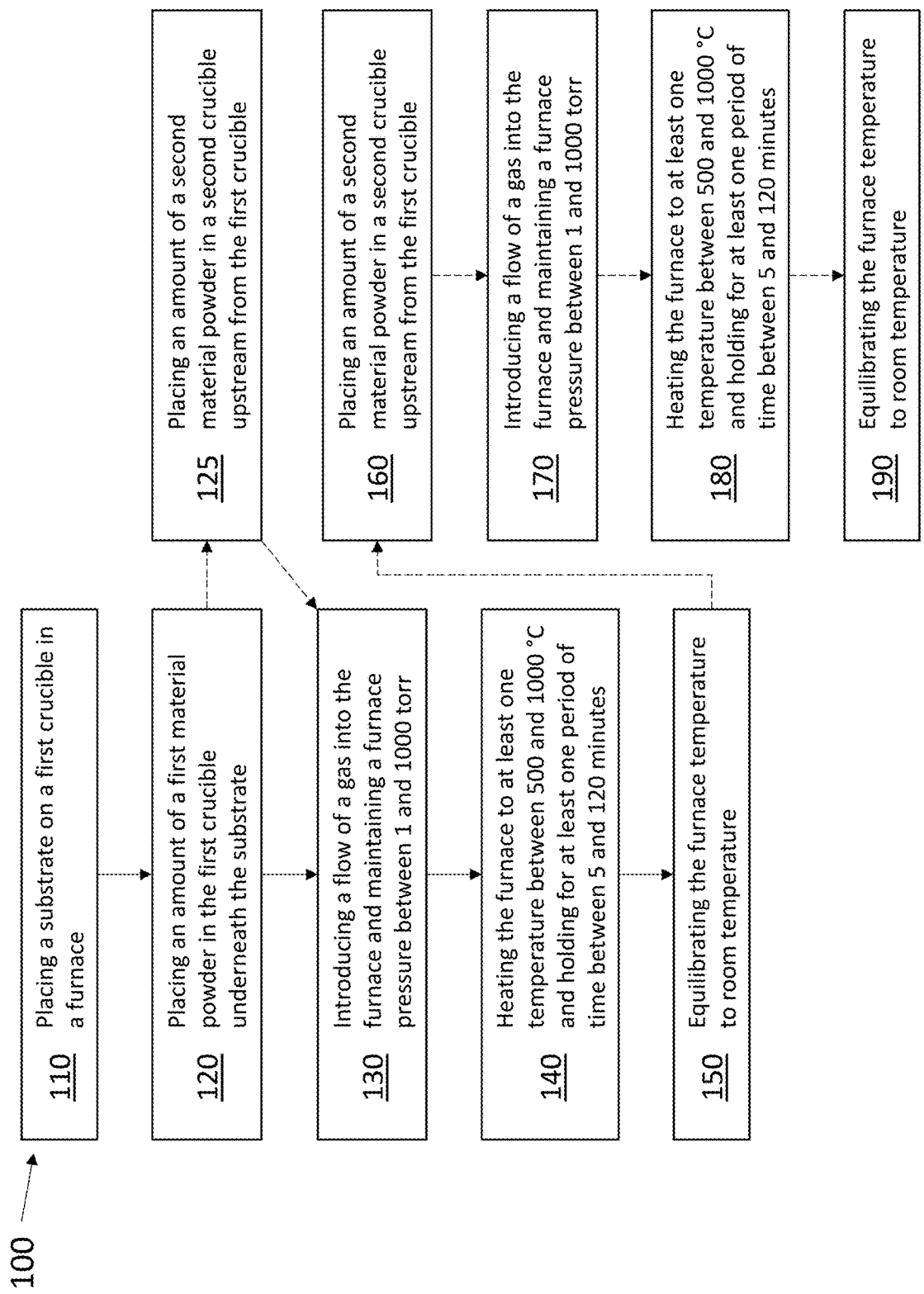
FIG. 2 is a flowchart depicting an exemplary method of fabricating vertical 2D structures, including additional steps for fabricating vertical 2D structures from two materials, or for annealing a second material to fabricated vertical 2D structures.

Referring now to FIG. 2, an exemplary method 100 of fabricating vertical 2D structures is depicted. Method 100 begins with step 100, wherein a substrate is placed on a first crucible in a furnace. In step 120, an amount of a first material powder is placed in the first crucible underneath the substrate. In certain embodiments, wherein the vertical 2D structures is cosynthesized with a second material, step 125 places an amount of the second material powder in a second crucible upstream from the first crucible. In step 130, the furnace pressure is set to between 1 and 1000 torr, and a flow of a gas is introduced into the furnace. In step 140, the furnace temperature is increased to at least one temperature between 500 and 1000° C. and held for at least one period of time between 5-120 minutes. In step 150, the furnace is allowed to equilibrate to room temperature. In certain embodiments, wherein a second material is to be annealed to the vertical 2D structures fabricated using method 100, method 100 further comprises step 160, wherein an amount of a second material powder is placed in a second crucible upstream from the first crucible. In step 170, the furnace pressure is set to between 1 and 1000 torr, and a flow of a gas is introduced into the furnace. In step 180, the furnace temperature is increased to at least one temperature between 500 and 1000° C. and held for at least one period of time between 5-120 minutes. In step 190, the furnace is allowed to equilibrate to room temperature.

The resulting structures fabricated by method 100 are freestanding, two-dimensional (or planar), and electrically isolated. In one embodiment, the resulting structures are substantially perpendicular to the plane of the substrate surface. In other embodiments, the resulting structures are angled relative to the plane of the substrate surface. For example, in certain embodiments, the angle between the resulting structures and the plane of the substrate surface can be between 1° and 90°.

Figure 3A:
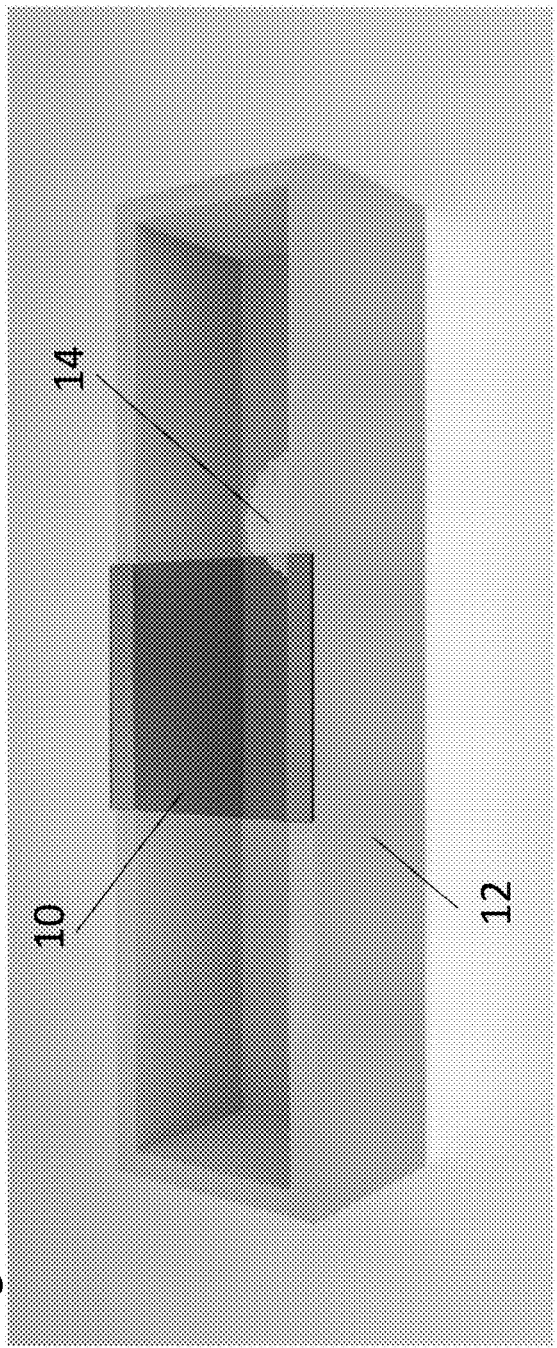
FIG. 3A and FIG. 3B depict the arrangement of components in the exemplary method of fabricating vertical 2D structures of FIG. 2.
Figure 3B:
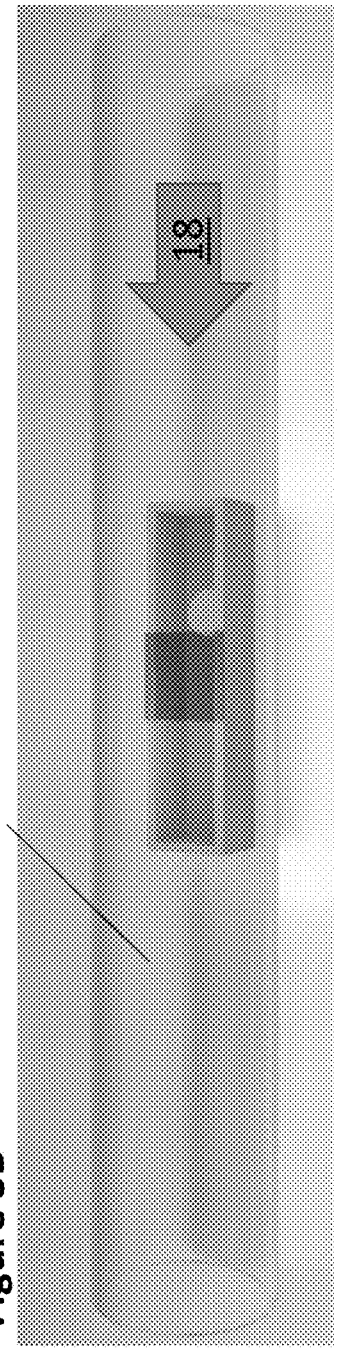

Referring now to FIGS. 3A and 3B, the arrangement of components in method 100 according to FIG. 2 is depicted. In one embodiment, substrate 10 is placed on crucible 12, and an amount of material powder 14 is placed in crucible 12 underneath substrate 10. In one embodiment, substrate 10, crucible 12, and material powder 14 are placed in furnace 16, whereupon a flow of gas 18 is introduced during the fabrication process.

Substrate 10 can be any substrate known to one of skill in the art, including but not limited to: SiC, sapphire, $SiO_2$, graphene, graphite, and the like. In one embodiment, substrate 10 comprises a material capable of withstanding furnace temperatures, for example a temperature of at least 500° C. Substrate 10 can have a crystalline structure (such as sapphire, silicon, silicon carbide, graphene, and the like) or an amorphous structure (such as non-alkali glass, $SiO_2$, and the like), or a polycrystalline structure (such as poly-SiC, poly-Si, and the like).

Material powder 14, can be any suitable material that can be vaporized in a furnace or introduced into the furnace in a vapor form. In some embodiments, material powder 14 is a metal precursor. In one embodiment, material powder 14 can be a material suitable for use in semiconductors. Such materials can be any transition metal oxide, including but not limited to molybdenum trioxide, molybdenum dioxide, tungsten trioxide, chromium trioxide, and the like. In one embodiment, material powder 14 comprises molybdenum trioxide. In one embodiment, material powder 14 comprises 2 mg molybdenum trioxide. In another embodiment, the material powder 14 is a liquid or solid with a high vapor pressure that is suitable for traditional metal-organic chemical vapor deposition (CVD). Example precursors include, but are not limited to, molybdenum hexacarbonyl, molybdenum hexafluoride, molybdenum pentachloride, or any other transition metal compound easily vaporized. Any amount of material powder 14 can be employed. In one embodiment, the amount of material powder 14 is between 1 mg and 1000 mg. In one embodiment, the amount of material powder 14 is 2 mg. In one embodiment, material powder 14 is molybdenum trioxide ($MoO_3$).

Crucible 12 can be any sized or shaped container suitable for holding a material within a furnace. Non-limiting examples include alumina crucibles, graphite crucibles, quartz crucibles, zirconia crucibles, and the like. In one embodiment, crucible 12 is a no-slip crucible. In various embodiments, the invention encompasses methods wherein a crucible is optional. For instance, in one embodiment, the methods may comprise placing an amount of a material in a furnace, followed by placing a substrate over the amount of the material. Gas 18 can be any suitable gas typically used in furnaces. In one embodiment, gas 18 is an inert gas such as argon, nitrogen, helium, and the like. In other embodiments, gas 18 is a reactive gas such as hydrogen or fluorine. The gas flow rate can be any suitable flow rate. In one embodiment, the flow rate is between 10 and 10000 standard cubic centimeters per minute (sccm).

Figure 4:
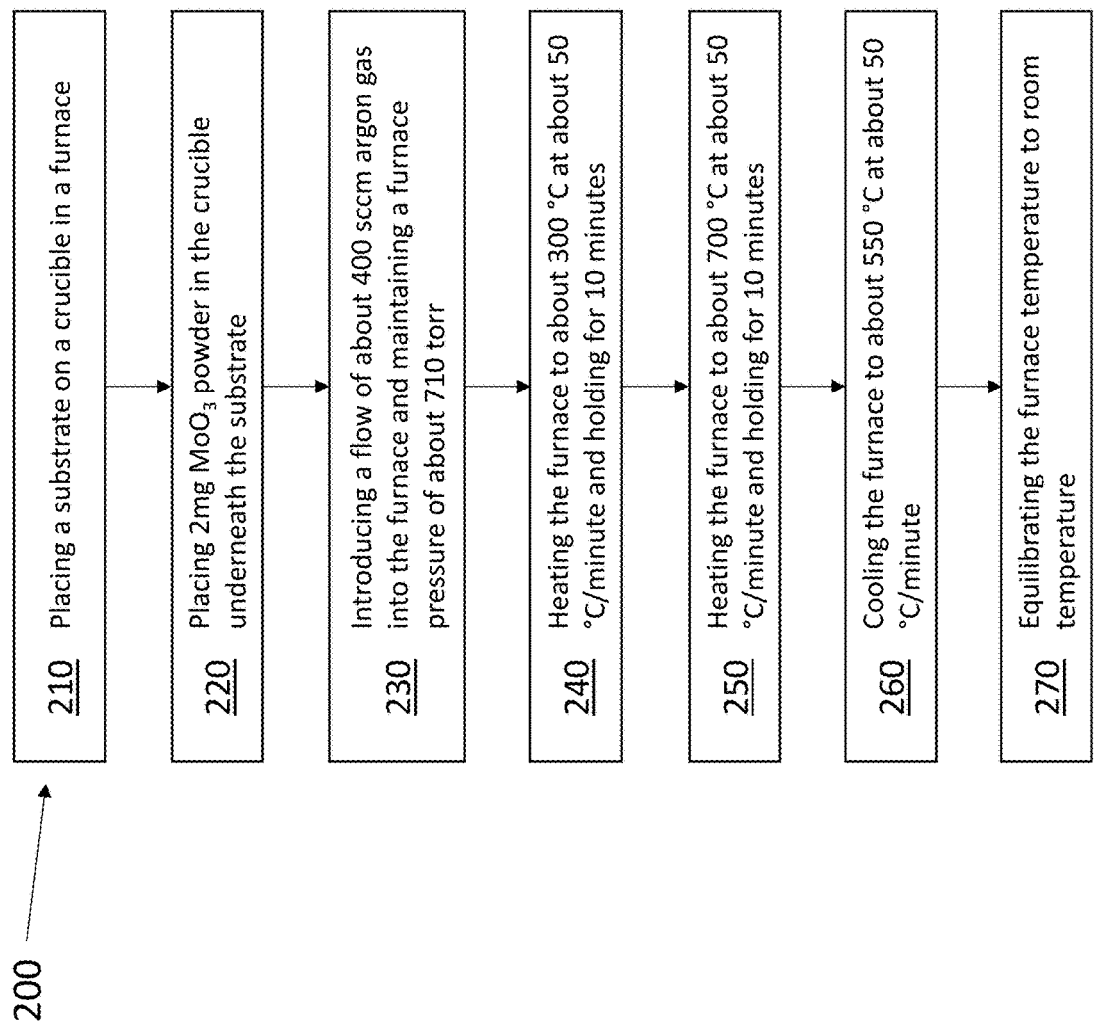
FIG. 4 is a flowchart depicting an exemplary method of fabricating vertical 2D $MoO_2$ structures.

In one embodiment, the invention provides methods for making vertical 2D $MoO_2$ structures. Referring now to FIG. 4, method 100 has been adapted for fabricating vertical 2D $MoO_2$ structures in method 200. Method 200 begins with step 210, wherein a substrate is placed on a crucible in a furnace. In step 220, 2 mg $MoO_3$ powder is placed in the crucible underneath the substrate. In step 230, the furnace pressure is set to about 710 torr, and a flow of argon gas at about 400 standard cubic centimeters per minute (sccm) is introduced into the furnace. In step 240, the furnace temperature is increased to about 300° C. at a rate of about 50° C./min, and the temperature is held at about 300° C. for 10 minutes. In step 250, the furnace temperature is increased to about 700° C. at a rate of about 50° C./min, and the temperature is held at about 700° C. for 10 minutes. In step 260, the furnace temperature is cooled to about 550° C. at a rate of about 50° C./min. In step 270, the furnace is allowed to equilibrate to room temperature.

Figure 5:
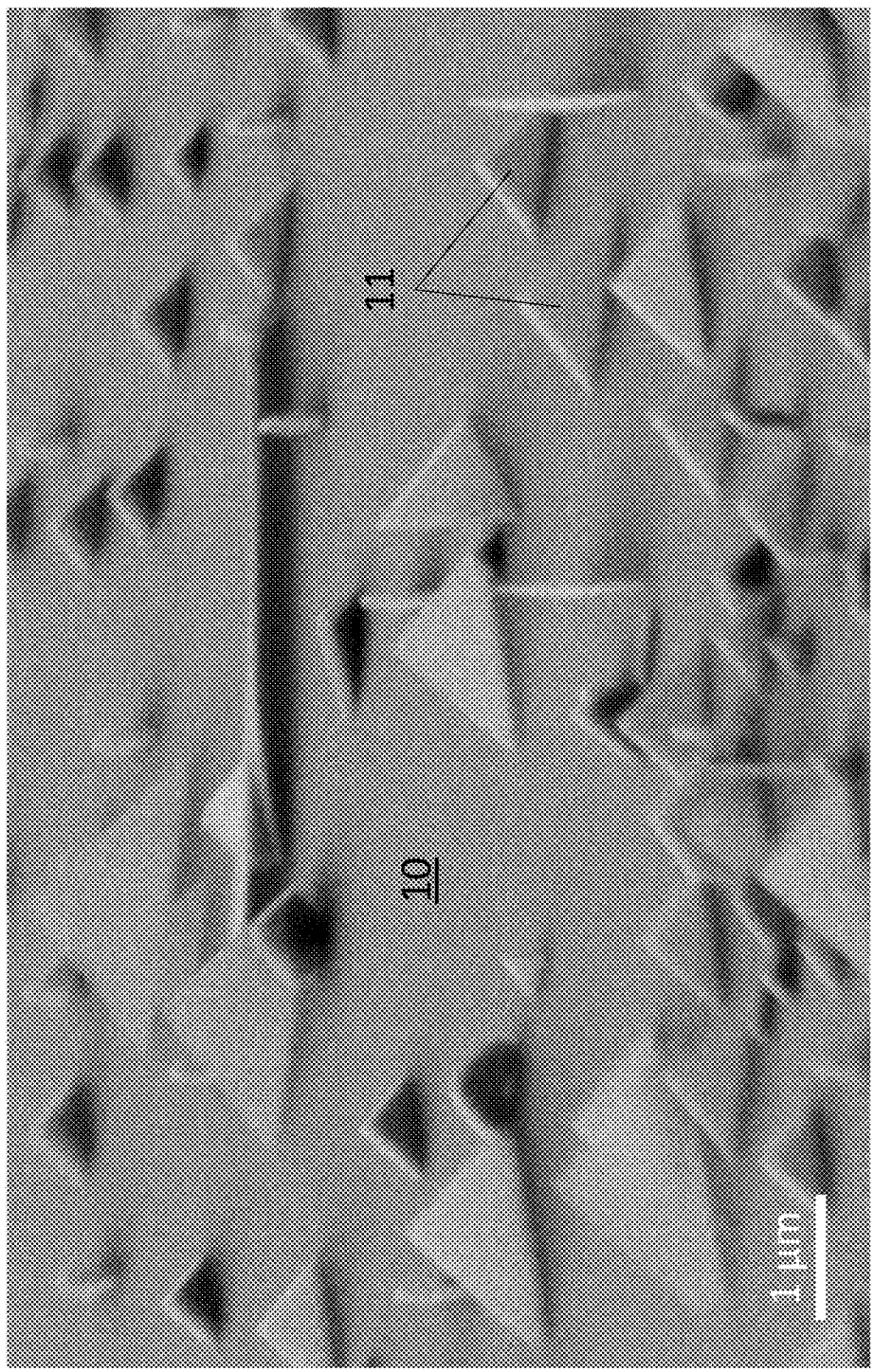
FIG. 5 is a tilted SEM image of $MoO_2$ vertical fins grown on a 6H—SiC substrate.

Referring now to FIG. 5, an SEM image of exemplary $MoO_2$ vertical 2D fin structures 11 fabricated on substrate 10 by method 200 is depicted. The SEM image is of a tilted substrate to better capture the vertical freestanding nature of the 2D fin structures.

The unique architecture of the vertical 2D structures fabricated by the methods of the present invention lend themselves to many useful applications, such as in 2D "fin" field effect transistors (finFETs) and other types of semiconductors. Additionally, the vertical structures may be applicable in catalysis and energy harvesting (i.e. photovoltaics). To facilitate their use, the vertical 2D structures may be treated using commonly known methods. In one embodiment, a coating can be applied to the vertical 2D structures, including but not limited to conductive coatings, insulating coatings, protective coatings, and the like. Those knowledgeable in the art will understand that any technique may be used to apply such coatings, including chemical vapor deposition, atomic layer deposition, annealing, and e-beam evaporation.

Figure 6:
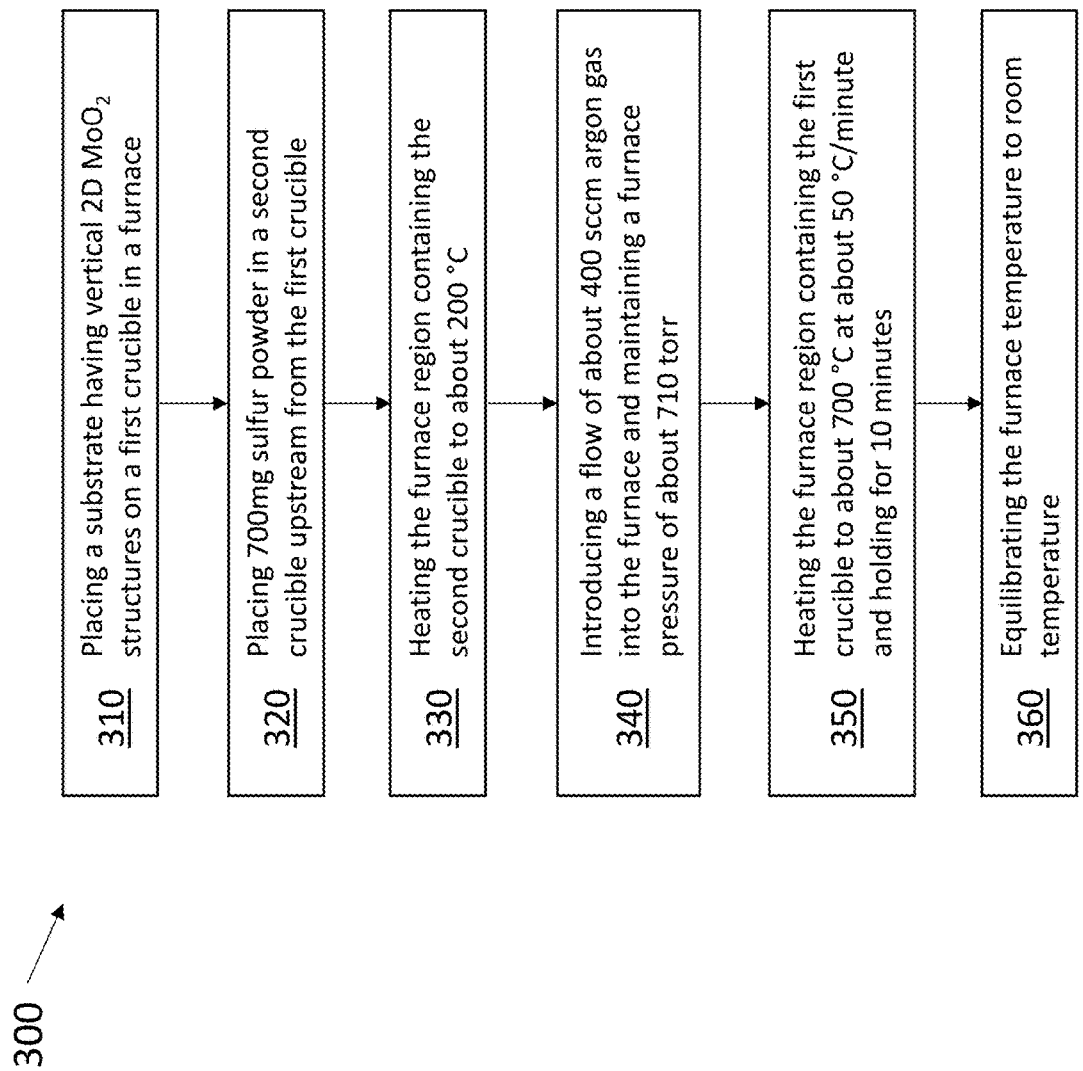
FIG. 6 is a flowchart depicting an exemplary method of annealing a second material to vertical 2D structures.
Figure 7:
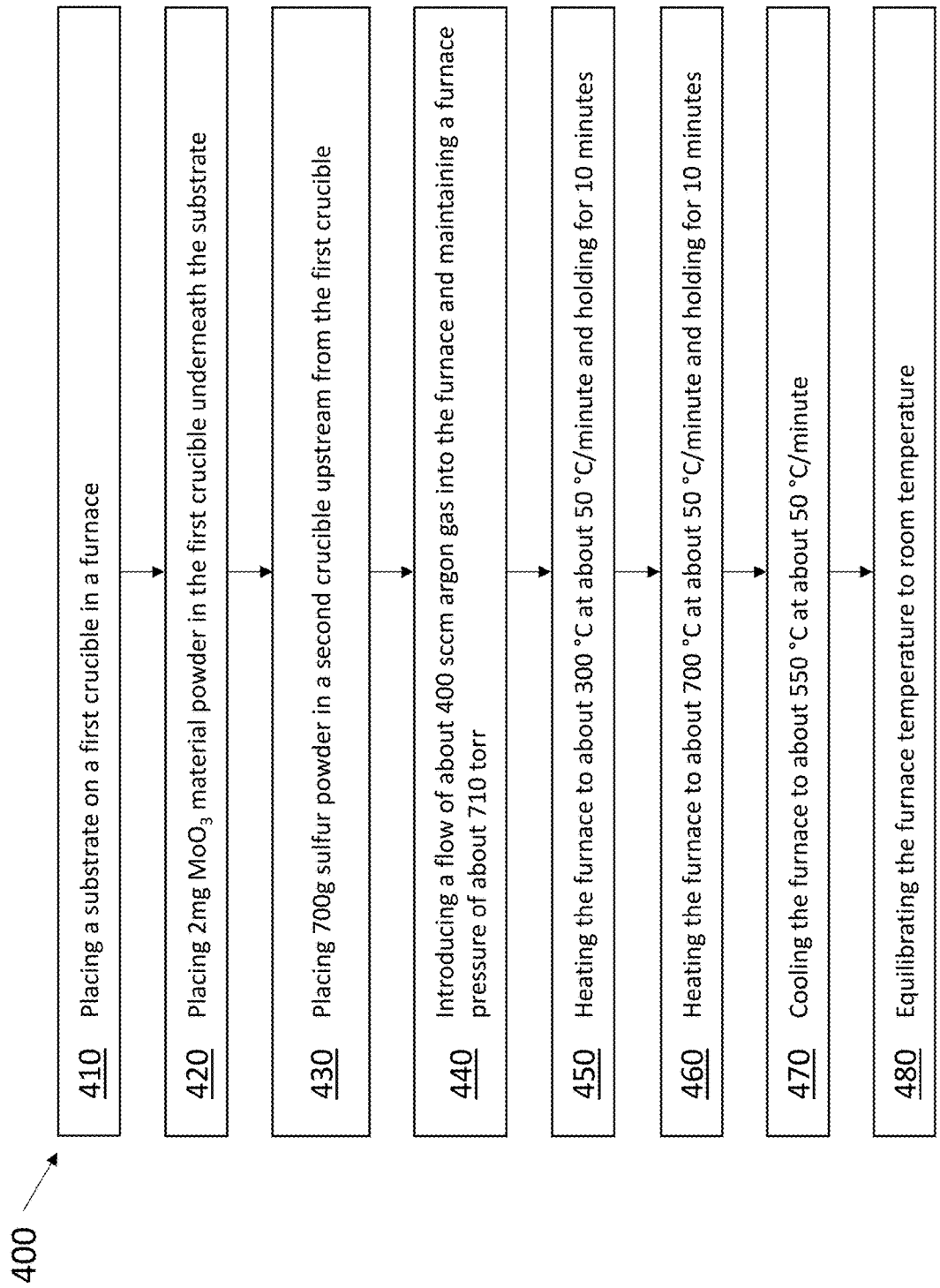
FIG. 7 is a flowchart depicting an exemplary method of fabricating vertical 2D structures from two materials.
Figure 9:
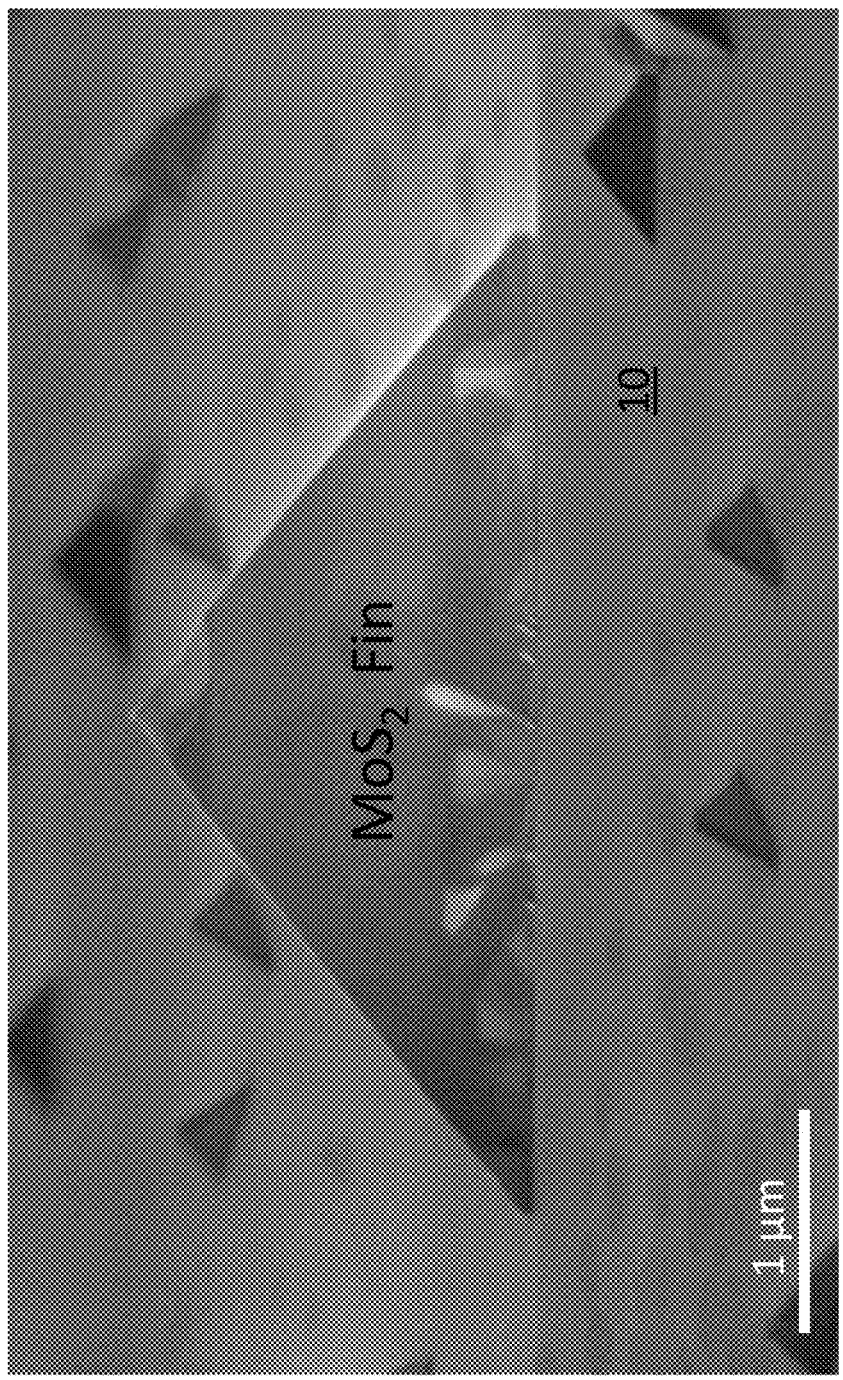
FIG. 9 depicts a tilted SEM image of an exemplary vertical 2D fin structure fabricated using the method of FIG. 6 or FIG. 7.

Referring now to FIG. 6 and FIG. 7, method 100 has been adapted to two different techniques for fabricating vertical 2D $MoS_2$ structures (such as in FIG. 9). In FIG. 6, method 100 has been adapted to anneal sulfur to vertical 2D $MoO_2$ structures in method 300. Method 300 begins with step 310, wherein a substrate having vertical 2D $MoO_2$ structures is placed on a first crucible in a furnace. In step 320, 700 mg sulfur powder is placed in a second crucible upstream from the first crucible. In step 330, the region of the furnace containing the second crucible is heated to about 200° C. In step 340, the furnace pressure is set to about 710 torr, and a flow of argon gas at about 400 sccm is introduced into the furnace. In step 350, the region of the furnace containing the first crucible is heated to about 700° C. at a rate of about 50° C./min, and the temperature is held at about 700° C. for 10 minutes. In step 360, the furnace is allowed to equilibrate to room temperature.

In FIG. 7, method 100 has been adapted to synthesize vertical 2D $MoS_2$ structures from $MoO_3$ and sulfur powder in method 400. Method 400 begins with step 410, wherein a substrate is placed on a first crucible in a furnace. In step 420, 2 mg $MoO_3$ powder is placed in the first crucible underneath the substrate. In step 430, 700 mg sulfur powder is placed in a second crucible upstream from the first crucible. In step 440, the furnace pressure is set to about 710 torr, and a flow of argon gas at about 400 sccm is introduced into the furnace. In step 450, the furnace temperature is increased to about 300° C. at a rate of about 50° C./min, and the temperature is held at about 300° C. for 10 minutes. In step 460, the furnace temperature is increased to about 700° C. at a rate of about 50° C./min, and the temperature is held at about 700° C. for 10 minutes. In step 470, the furnace temperature is cooled to about 550° C. at a rate of about 50° C./min. In step 480, the furnace is allowed to equilibrate to room temperature.

Figure 8A:
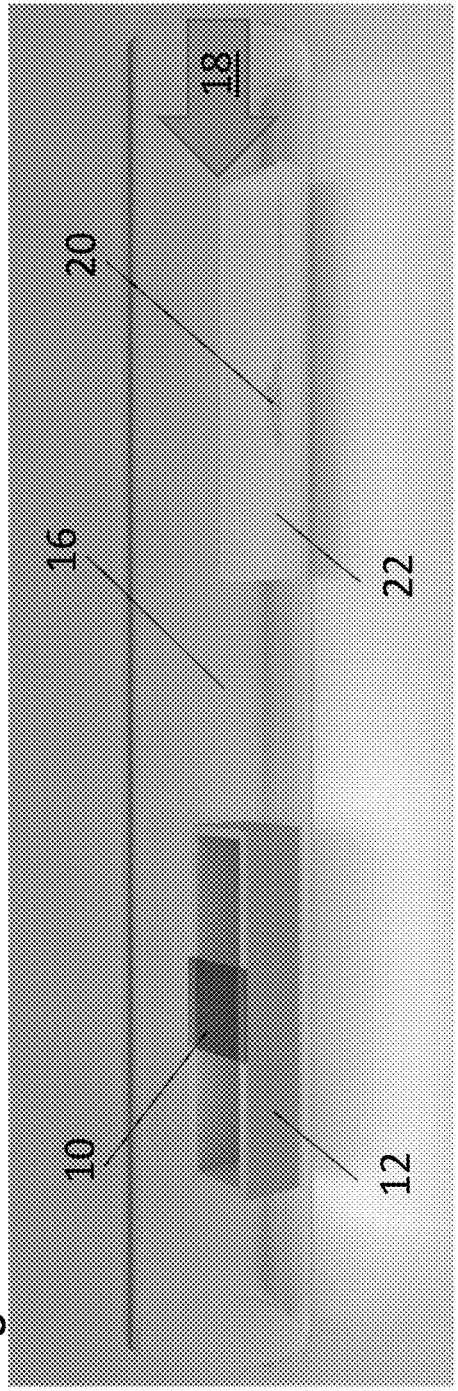
FIG. 8A and FIG. 8B depict the arrangement of components in the exemplary methods of FIG. 6 and FIG. 7, respectively.
Figure 8B:
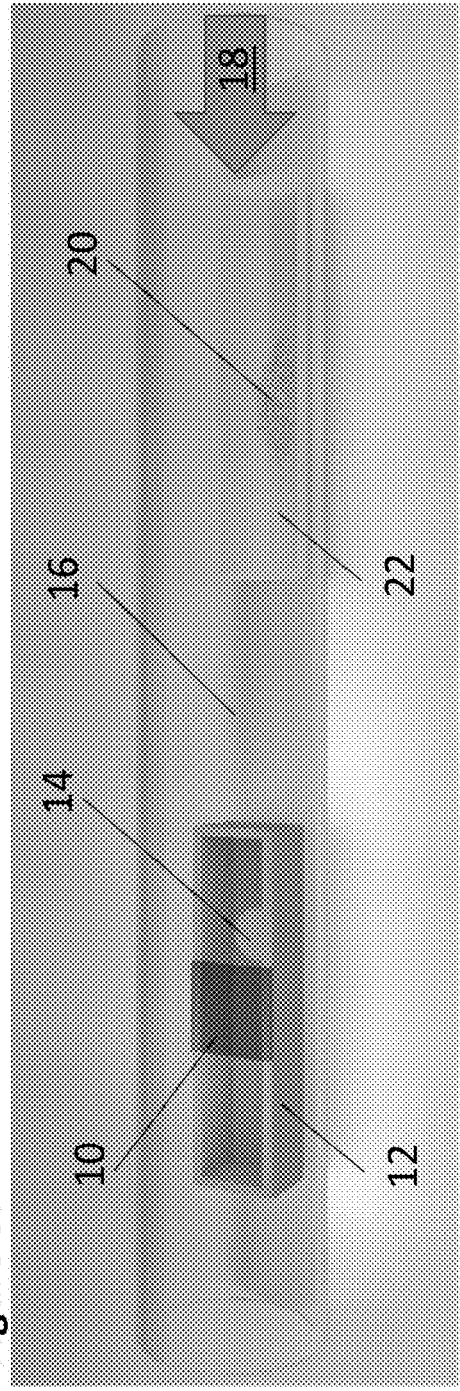

Referring now to FIG. 8A and FIG. 8B, the arrangement of components in method 300 and method 400 according to FIG. 6 and FIG. 7 are depicted, respectively. In FIG. 8A, substrate 10 having vertical 2D structures is placed on crucible 12, and an amount of material powder 20 is placed in crucible 22 upstream of crucible 12. The entire arrangement is placed in furnace 16, whereupon a flow of gas 18 is introduced during the fabrication process. In FIG. 8B, substrate 10 is placed face down on top of crucible 12, and an amount of material powder 14 is placed in crucible 12 below substrate 10. An amount of material powder 20 is placed in crucible 22 upstream from crucible 12. The entire arrangement is placed in furnace 16, whereupon a flow of gas 18 is introduced during the fabrication process.

In some embodiments, material powder 14 and material powder 20 can be placed in a furnace having different heating zones, such that each material powder 14 and material powder 20 can be subjected to different temperatures at different times. For example, in any of the preceding methods, material powder 14 may be placed in a first heating zone, and material powder 20 may be placed in a second heating zone. While the first heating zone may be heated to 750° C. at 50° C./min, the second heating zone may be heated rapidly to 250° C. to quickly vaporize material powder 20.

Material powder 20, known as the "chalcogen precursor", can be any suitable material that can be vaporized in a furnace. In one embodiment, material powder 20 can be a material suitable for use in semiconductors. In one embodiment, material powder 20 is a material compatible with material powder 14 to form a 2D or vertical layered material. In one embodiment, material powder 20 is a material comprising a chalcogen element, including but not limited to sulfur, selenium, tellurium, and the like. In on embodiment, material powder 20 comprises sulfur. In one embodiment, material powder 20 is sulfur powder. In one embodiment, material powder 20 is a liquid at room temperature. In one embodiment, material powder 20 is a solid at room temperature. Alternatively, the chalcogen precursor can be introduced into the furnace as a vapor in the traditional manner that metal-organic chemical vapor deposition is accomplished. Examples of vapor chalcogen precursor include but are not limited to diethyl sulfide, hydrogen disulfide, or any other high vapor pressure chalcogen containing precursor. Persons skilled in the art will readily understand that techniques such as metal-organic CVD (MOCVD) or CVD can identify suitable vapor chalcogen precursors and suitable processing parameters based on the precursor vapor pressure. Any amount of material powder 20 can be employed. In one embodiment, the amount of material powder 20 is between 1 mg and 10,000 mg. In one embodiment, the amount of material powder is 700 mg.

Crucible 22, like crucible 12, can be any sized or shaped container suitable for holding a material within a furnace, such as alumina crucibles, graphite crucibles, quartz crucibles, zirconia crucibles, and the like. In various embodiments, the invention encompasses methods wherein a crucible is optional. In one embodiment, crucible 22 is a no-slip crucible.

In one embodiment, the partial pressure of material powder 14 and material powder 20 affects the growth of the vertical 2D structure. In one embodiment, the partial pressure of material powder 20 at the surface of the substrate is constant. In one embodiment, upon heating, material powder 14 exhibits a gradient in partial pressure which is at its maximum directly above material powder 14. In one embodiment, material powder 14 is placed directly under the substrate. In one embodiment, material powder 14 is placed upstream of the substrate. In one embodiment, material powder 14 is placed downstream of the substrate.

Referring now to FIG. 10A and FIG. 10B, TEM images of exemplary vertical 2D $MoS_2$ fins are depicted. FIG. 10B, a magnified portion of FIG. 10A, shows the orderly, parallel layers of the $MoS_2$ fin. Exemplary $MoS_2$ fins comprise 20 individual layers or less, with each layer being about 0.6 nm in thickness. What appears to be striations in FIG. 9B are the van der Waals gaps between each layer. (It should be noted that the curvature of the fin in FIG. 10A is a result of the sample preparation process for performing transmission electron microscopy on the fins and is not intrinsic to the fins.)

Beyond homogenous vertical 2D structures, the invention also relates to the fabrication of vertical 2D heterostructures. For example, as depicted in FIG. 10, $MoS_2$ fins can be transformed to have an outer layer of $MoSe_2$ through ion exchange processes. This process lends itself to a large variety of combinations of 2D heterostructures, including but not limited to $MoS_2/MoSe_2$, $MoS_2/MoTe_2$, $MoSe_2/MoTe_2$, or any other combinations involving a center layered structure dissimilar to the outer layered structure.

In various embodiments, the methods of the invention are amenable to modification using techniques such as CVD, MOCVD, molecular beam epitaxy (MBE), atomic layer deposition (ALD), pulsed laser deposition (PLD), and the like.

EXPERIMENTAL EXAMPLES

The invention is further described in detail by reference to the following experimental examples. These examples are provided for purposes of illustration only, and are not intended to be limiting unless otherwise specified. Thus, the invention should in no way be construed as being limited to the following examples, but rather, should be construed to encompass any and all variations which become evident as a result of the teaching provided herein.

Without further description, it is believed that one of ordinary skill in the art may, using the preceding description and the following illustrative examples, make and utilize the compounds of the present invention and practice the claimed methods. The following working examples therefore, specifically point out the preferred embodiments of the present invention, and are not to be construed as limiting in any way the remainder of the disclosure.

Figure 11:
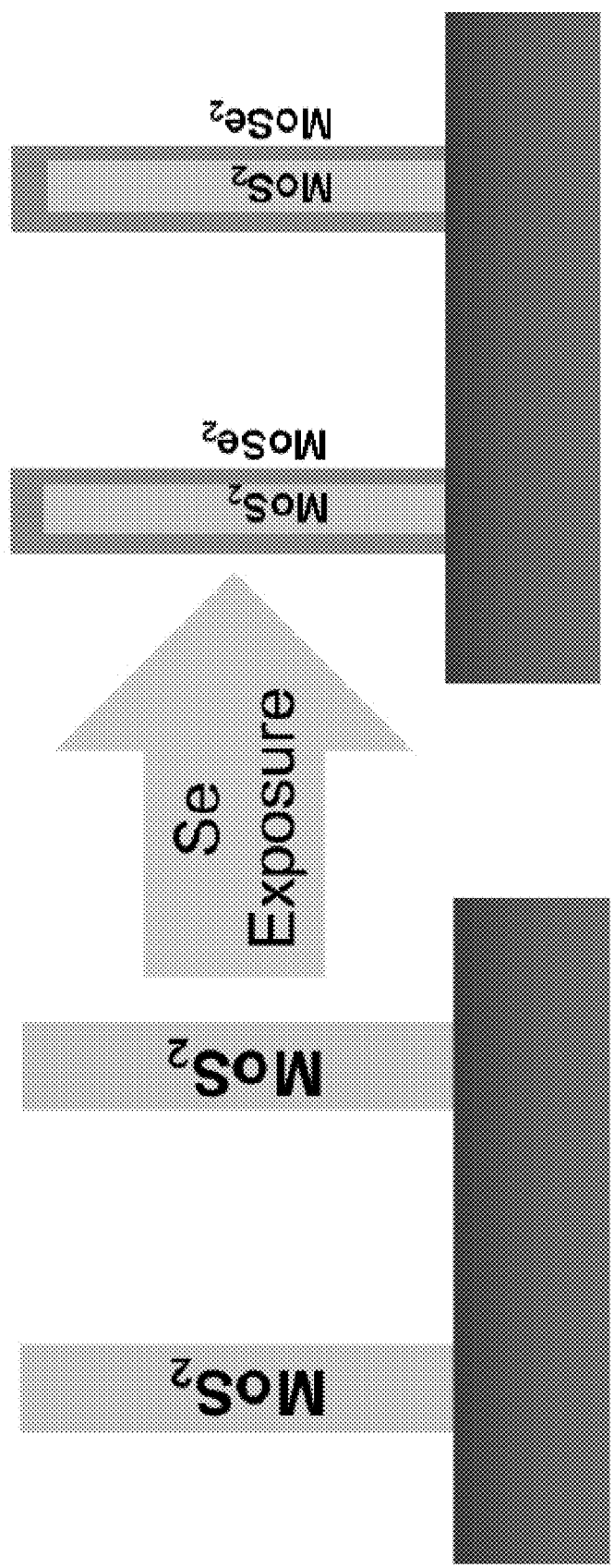
FIG. 11 depicts the formation of vertical 2D heterostructures.

Example 1: Metal Oxide Powder to Sulfur Ratio Plays an Important Role in the Formation of Lateral Versus Vertical Fins Low metal oxide powder (M) to sulfur (X) ratio lead to the typical growth seen in the art, wherein lateral 2D structures form on the surface of a substrate. Upon increasing the metal oxide powder to sulfur ratio, the structures grow vertically. However, if the metal oxide powder to sulfur ratio is too high, a dense forest of flower-like structures is formed, which is unusable for finFET-like applications (FIG. 11).

Example 2: Bottom-Up Synthesis of Vertically Oriented Two-Dimensional Materials Synthesis Semiconducting two-dimensional (2D) materials such as molybdenum disulfide ($MoS_2$) are of interest for their potential applications in digital electronics, catalytic reactions, optoelectronics, and energy storage (Jariwala et al., 2014, ACS Nano, 8:1102-1120; Zhao et al., 2013, Sci. Technol. Adv. Mater., 14:043501; Lopez-Sanchez et al., 2013, Nat. Nano., 8:497-501; Wang et al., 2012, Nat. Nano., 7:699-712). The "traditional" route to synthesizing such materials is powder vaporization (often referred to as chemical vapor deposition) (Wang et al., 2012, Nat. Nano., 7:699-712; Lee et al., 2012, Adv. Mater., 24:2320-2325; Wang et al., 2013, J. Am. Chem. Soc., 135:5304-5307; Bhimanapati et al., 2015, ACS Nano, 9:11509-11539; Lv et al., 2014, Acc. Chem. Res., 48:56-64; Wang et al., 2014, Chem. Mater., 26:6371-6379), where the equilibrium morphology is a strong function of the metal:chalcogen ratio (Mo:S for $MoS_2$) (Wang et al., 2014, Chem. Mater., 26:6371-6379; Cao et al., 2015, J. Phys. Chem. C, 119:4294-4301). Powder vaporization (PV) synthesis of $MoS_2$ can yield vertical $MoS_2$ structures (Zhou et al., 2014, Cryst. Eng. Com., 16:9025-9032; Dumcenco et al., 2015, 2D Mater., 2:044005), however, these structures are often ignored when the morphology evolution of $MoS_2$ is discussed (Wang et al., 2014, Chem. Mater., 26:6371-6379; Cao et al., 2015, J. Phys. Chem. C, 119:4294-4301), thereby completely omitting a major part of the Mo:S ratio impact on morphology in this deposition technique. Vertically grown $MoS_2$ exhibits enhanced catalytic activity at exposed edge sites (Kibsgaard et al., 2012, Nat. Mater., 11:963-969; Kong et al., 2013, Nano Lett., 13:1341-1347; Jung et al., 2014, Nano Lett., 14:6842-6849; Zhou et al., 2013, Small, 9:140-147; Yan et al., 2013, ACS Appl. Mater. Interfaces, 5:12794-12798; Ling et al., 2016, RSC Adv., 6:18483-18489; Karunadasa et al., 2012, Science, 335:698-702); therefore, understanding and controlling the synthesis of vertical $MoS_2$ is crucial. Furthermore, a fundamental understanding of the thermodynamics and kinetics governing the reaction, nucleation, and growth of $MoS_2$ from horizontal to vertical is vital for engineering layered material systems for the entire spectrum of applications. In the following study, the nucleation and growth mechanism of $MoS_2$ from vertical and horizontal is elucidated using experimental techniques and numerical solutions. The study reveals that the partial pressure ratio of molybdenum oxide to sulfur, and its distribution, governs the growth mode of $MoS_2$ between vertical and horizontal configurations.

The materials and methods are now described.

Synthesis

Prior to deposition, substrates were cleaned by sonication in acetone and isopropanol alcohol for 10 minutes each, then rinsed with deionized (DI) water. Substrates were then immersed in a heated piranha solution at 80° C. for 20 minutes and rinsed again with DI water. Preparation of the graphene substrate was completed by high-pressure silicon sublimation of 6H—SiC, as explained in detail elsewhere (Virojanadara et al., 2008, Phys. Rev, 78: 245403). PV deposition of $MoS_2$ was completed by placing a single substrate face down in an alumina crucible 8.5 mm from a 1 mg $MoO_3$ source (99.8%, Sigma-Aldrich). The crucible was placed at the center of a custom tube furnace within the primary hot zone. A fused quartz crucible with 250 mg of sulfur powder (99.995%, Alfa Aesar) was placed upstream from the alumina crucible in a secondary hot zone to independently control the rate of vaporization and sublimation of the precursors. The furnace was then evacuated to remove impurities and filled with argon gas (99.99%) with a mass flow rate of 450 sccm, the pressure of the tube furnace was maintained at 710 torr throughout deposition. The primary hot zone was heated to 750° C. at a rate of 50° C.·min-1 and the secondary hot zone was rapidly heated to 250° C. to vaporize the sulfur. Argon gas carries the sulfur vapor to the $MoO_3$ source and substrate, allowing for reaction of the precursors and adsorption onto the substrate. After 10 minutes at 750° C., the furnace was cooled at a rate of 30° C.·min-1 to room temperature. The same procedure is followed for the synthesis of $MoO_2$ fins, however, the sulfur precursor was removed. Sulfurization of $MoO_2$ fins also was completed using the same experimental procedure above, however, the $MoO_3$ precursor was removed to prevent further deposition of $MoO_2$.

Characterization

SEM images were recorded on a Merlin (Carl Zeiss, Oberkochen, Germany) field-emission SEM utilizing the in-lens secondary electron detection mode with a 10 kV accelerating voltage. Raman spectroscopy was performed on a LabRAM HR Evolution (Horiba, Kyoto, Japan) operated at room temperature with a 488 nm excitation wavelength. In order to preserve the as-grown morphology of vertical fins during focused ion beam (FIB) milling, a 100 nm conformal coating of hafnium oxide ($HfO_2$) and/or alumina ($Al_2O_3$) was deposited by atomic layer deposition using a 150 LE (Kurt J. Lesker, Pennsylvania, USA) heated to 250° C. To prevent charging during FIB milling, a conductive 10/50 nm titanium and gold layer was deposited by electron-beam evaporation in a LAB-18 (Kurt J. Lesker, Pennsylvania, USA). Cross-sectional TEM specimens were prepared with a Nova 200 DualBeam (FEI, Oregon, USA) FIB-SEM equipped with an OmniProbe manipulator (Oxford Instruments, Abingdon, United Kingdom). Upside-down transfer and milling technique was applied to avoid the curtain effect. Cross-sectional samples were thinned to 100 nm with a 30 kV Ga ion beam and then to 70 nm with a 5 kV Ga ion beam to remove surface damage caused by 30 kV ion beam. HAADF-STEM and ABF-STEM images were recorded with a JEM-ARM200F (JEOL, Tokyo, Japan) aberration-corrected electron microscope. In all the experiments, the microscope was operated in STEM mode at 200 kV and the convergence semi-angle of the incident electron beam was set to be 24 mrad with a probe size of approximately 0.1 nm in diameter.

Modeling

Vaporization and sublimation of powder precursors during powder vaporization (PV) synthesis introduces concentration gradients, particularly when the substrate is near the powder source. Using information from the experimental setup (temperature profile, furnace dimensions, crucible dimensions, gas flow, and gas pressure) elucidated the role concentration (analogous to partial pressure) plays in the observed morphology evolution. Utilizing the finite element modeling technique, the heat transfer (Equation 1), diffusion (Equation 2), and Navier-Stokes (Equation 3) equations were solved which determined the concentration of $MoO_3$ (COMSOL Multiphyscis, User's Guide, COMSOL AB, Burlington, Mass. 2011).

$$Q = \rho C_p \frac{\partial T}{\partial t} + \rho C_p u \cdot \nabla T + \nabla \cdot q; \; q = -k\nabla T \quad \text{Equation (1)}$$

$$R = \frac{\partial c}{\partial t} + \nabla \cdot (-D\nabla c) + u \cdot \nabla c; \; N = -D\nabla c + u \quad \text{Equation (2)}$$

$$\rho\left(\frac{\partial u}{\partial t} + u \cdot \nabla u\right) = \quad \text{Equation (3)}$$
$$-\nabla p + \nabla \cdot \left(\mu(\nabla u + (\nabla u)^T) - \frac{2}{3}\mu(\nabla \cdot u)I\right) + F;$$
$$\frac{\partial \rho}{\partial t} + \nabla \cdot (\rho u) = 0$$

where $\rho$ is density, $C_p$ is the solid heat capacity at constant pressure, T is the temperature, $\mu$ is the velocity of the carrier gas that is obtained by solving the Navier-Stokes equations, q is the heat flux vector, k is the thermal conductivity coefficient, Q is the heat source, c is the concentration of $MoO_3$, D is the diffusion coefficient, R is the source, p is the pressure, $\mu$ is the viscosity, I is the identity tensor, and F are the external applied forces. The concentration of $MoO_3$ in the crucible after 10 minutes at 750° C. is plotted in FIG. 12A and FIG. 12B, the concentration on the substrate and a typical substrate after deposition are shown in FIG. 12C.

Figures 12A, 12B, 12C:
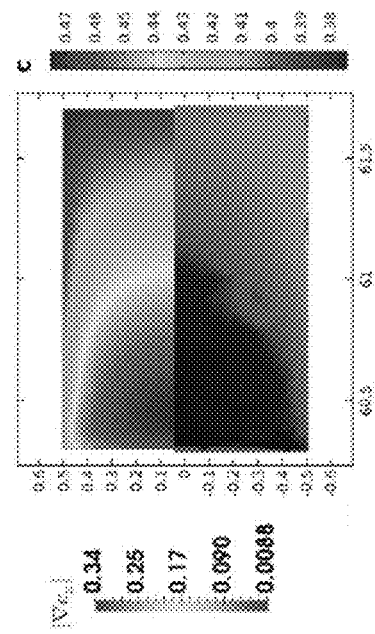
FIG. 12A through FIG. 12C depict numerical simulations of $MoO_3$ concentration and comparison with experimental results.

FIG. 12A through FIG. 12C clearly show that there is a decreasing concentration gradient in the crucible and on the surface of the substrate as the distance from the $MoO_3$ source increases. This decreasing concentration is due to mixing and diffusion of $MoO_3$ in the ambient gas as it is pushed upstream by the argon carrier gas. The parabolic shape of the concentration gradient plotted in FIG. 12C strongly resembles that of a typical substrate after deposition and is determined by the gas flow at the surface of the substrate. These results demonstrate that the primary experimental parameter responsible for the observed morphology evolutions from vertical fins to lateral domains is the partial pressure gradient of $MoO_3$ on the surface of the substrate.

The coupled set of heat transfer (Equation 1), diffusion (Equation 2), and Navier-Stokes (Equation 3) equations were solved simultaneously for the reaction chamber, encompassing the source, substrate, and crucible. Commercial finite element software package COMSOL with free tetrahedral mesh elements, PARADISO direct solver, and backward Euler method was used to solve the time-dependent equations (COMSOL Multiphyscis, User's Guide, COMSOL AB, Burlington, Mass. 2011). Different mesh densities were considered to ensure a mesh-independent solution. Constant temperature boundary condition was utilized along the walls of CVD furnace, which followed the experimentally measured temperature profile. Argon as the carrier gas (450 sccm inflow), an $Al_2O_3$ crucible, and a diffusion coefficient of 8e-4 $m^2$ $s^{-1}$ were considered with vanishing outflow of pressure.

The results are now described.

Figure 13A:
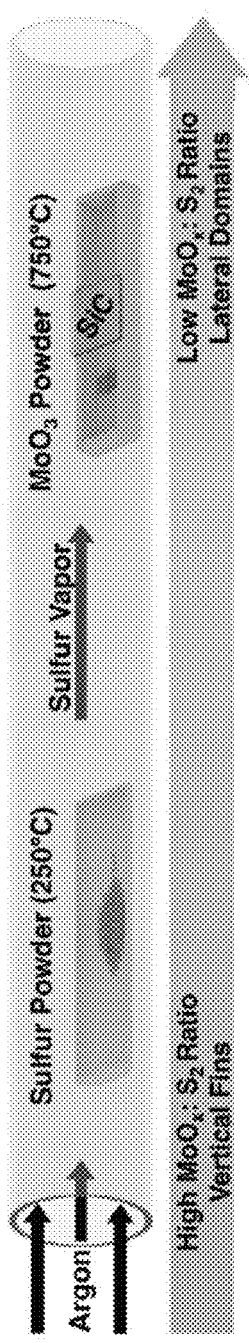
FIG. 13A through FIG. 13F depict the synthesis of $MoS_2$ accomplished via simultaneous sublimation and vaporization of molybdenum trioxide ($MoO_3$) and sulfur ($S_2$) respectively.

Synthesis of $MoS_2$ was accomplished via simultaneous sublimation and vaporization of molybdenum trioxide ($MoO_3$) and sulfur ($S_2$) respectively (Lee et al., 2012, Adv. Mater, 24: 2320-2325), the experimental set-up is illustrated in FIG. 13A. Considering the complex nature of the vaporization process and various controlling parameters affecting the growth of the $MoS_2$, which are not experimentally accessible, a model was created to understand the growth process of sublimation and transport of $MoO_3$ (FIG. 12A through FIG. 12C). The coupled system of equations governing the heat transfer, gas flow, and diffusion of $MoO_3$ were numerically solved using the finite element modeling technique (Equation 1 through Equation 3) (COMSOL Multiphyscis, User's Guide, COMSOL AB, Burlington, Mass. 2011). This simulation demonstrated the presence of a large concentration gradient of $MoO_3$ near the substrate, indicating a decrease in the partial pressure of $MoO_3$ as the distance from the $MoO_3$ source increases. Alternatively, the long distance between the sulfur source and substrate yields a uniform partial pressure of $S_2$ over the substrate surface. Furthermore, it is noted that $MoO_3$ reduces to $MoO_2$ in the vapor phase due to the relative stability of $MoO_2$ compared to $MoO_3$ (Spevack et al., 1992, J. Phys. Chem, 96: 9029-9035), which results in a mixture of various molybdenum oxides in the gas phase (represented as "$MoO_x$" in this work). Growth kinetics were also affected by the rate of flow of precursor material, which is determined by the carrier gas flow pattern. Considering a no-slip condition on the substrate and walls of the crucible, it was demonstrated that less precursor reaches the areas close to the walls, which subsequently limits the growth rate. This is consistent with both experimental results and numerical simulations.

The $MoO_x$:$S_2$ partial pressure ratio, and its gradient, plays a critical role in the observed morphology evolution. This is evident in scanning electron microscopy (SEM) images of the resulting PV deposition on a silicon carbide (6H—SiC) substrate (FIG. 13B through FIG. 13D) as a function of distance from the MoO$_3$ precursor. Regions on the substrate near the MoO$_3$ source yield vertically oriented domains (referred to as "fins") (FIG. 13B) that evolve into a mixture of fins and lateral domains (FIG. 13C), and finally only lateral domains (FIG. 13D) as one moves away from the MoO$_3$ source. This behavior corresponds well to a high, intermediate, and low MoO$_x$:S$_2$ partial pressure ratio, respectively, and can be understood when considering surface and edge energy of MoS$_2$ are a function of gas composition and partial pressure of gas species (Cao et al., 2015, J. Phys. Chem. C, 119: 4294-4301). Changes in the surface and edge energy (ΔE) from a vapor/substrate system to a vapor/MoS$_2$/substrate system is a primary factor in determining the growth mode as layer-by-layer (ΔE<0, Frank-van der Merve) (Frank et al. 1949, Proc. R. Soc. London. A: Mathematical Phys. Sci, 198: 205), island (ΔE≥0, Volmer-Weber) (Volmer et al., 1926, Phys. Chem, 119: 277-301), or layer-plus-island (initial ΔE<0 followed by ΔE≥0, Stranski-Krastanov) (Stranski et al., 1937, Kl. Abtlg. IIb, 146: 797). Therefore, the MoO$_x$:S$_2$ partial pressure ratio modifies the surface and edge energy change and can indirectly affect the growth mode of MoS$_2$.

Figure 13B:
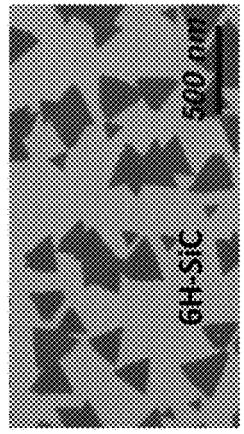
Figure 13C:
Figure 13D:
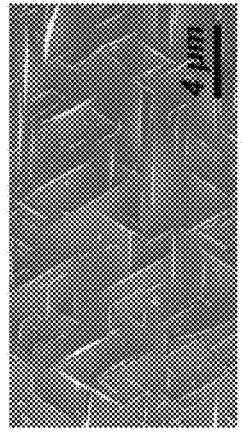
Figure 13E:
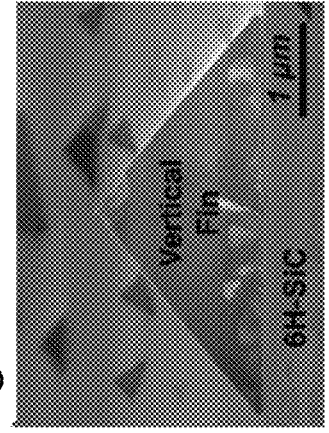
Figure 13F:
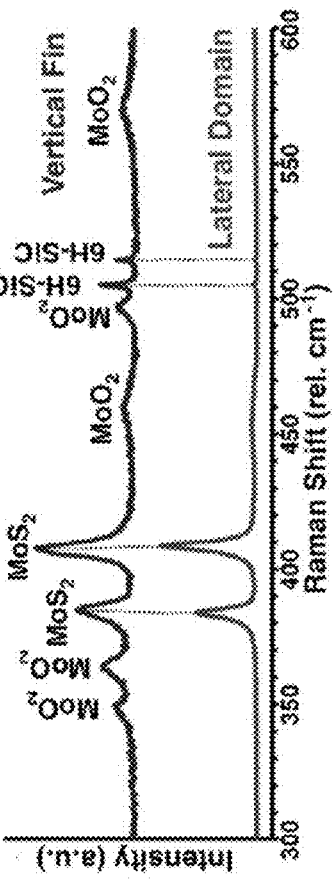
Figure 16:
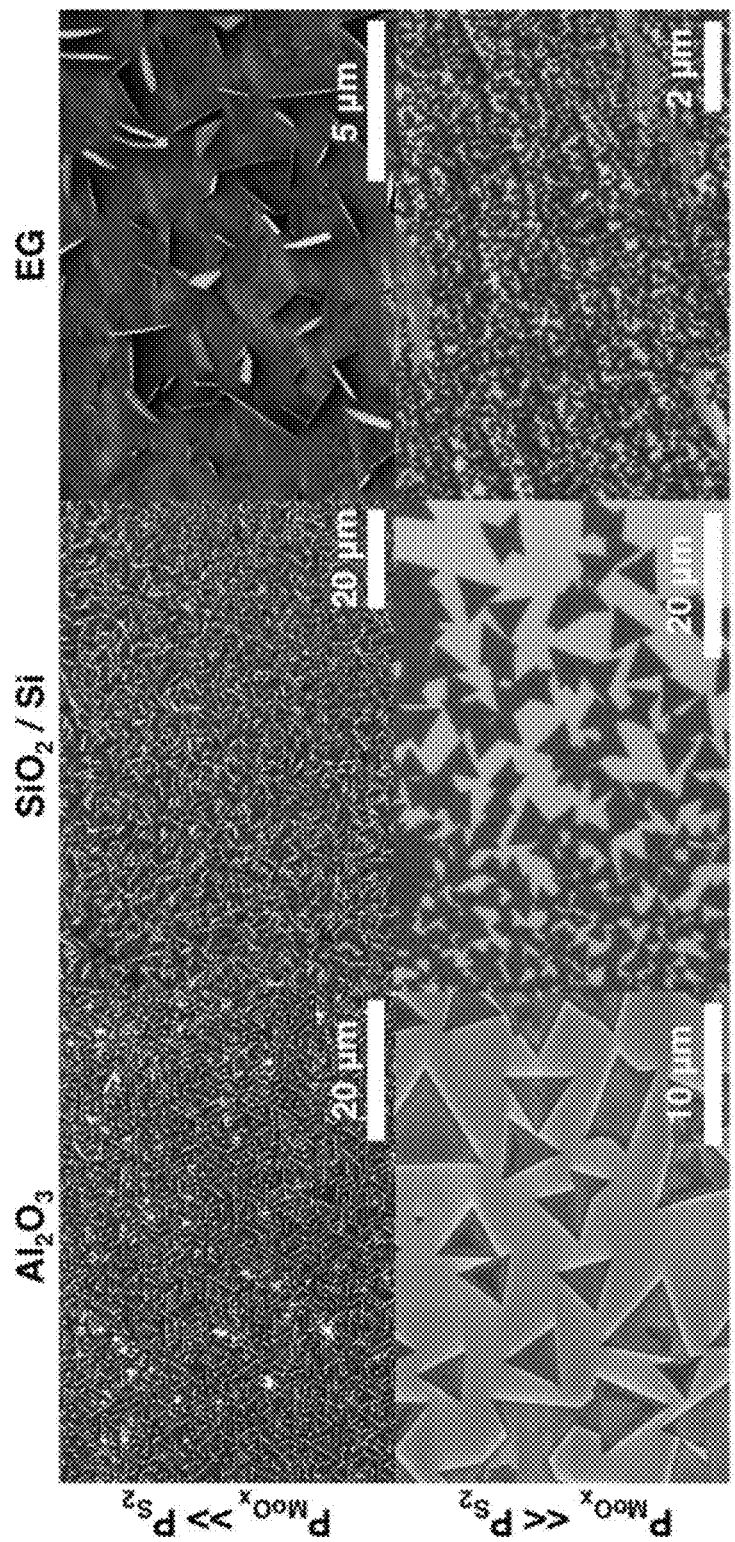
FIG. 16 depicts the effect of substrate on the morphology of as grown 2D materials; SEM micrographs of resulting $MoO_3/S_2$ co-flow PV deposition on $Al_2O_3$, $SiO_2/Si$, and EG substrates in regions with high and low $MoO_x:S_2$ partial pressure ratios.
Figure 17:
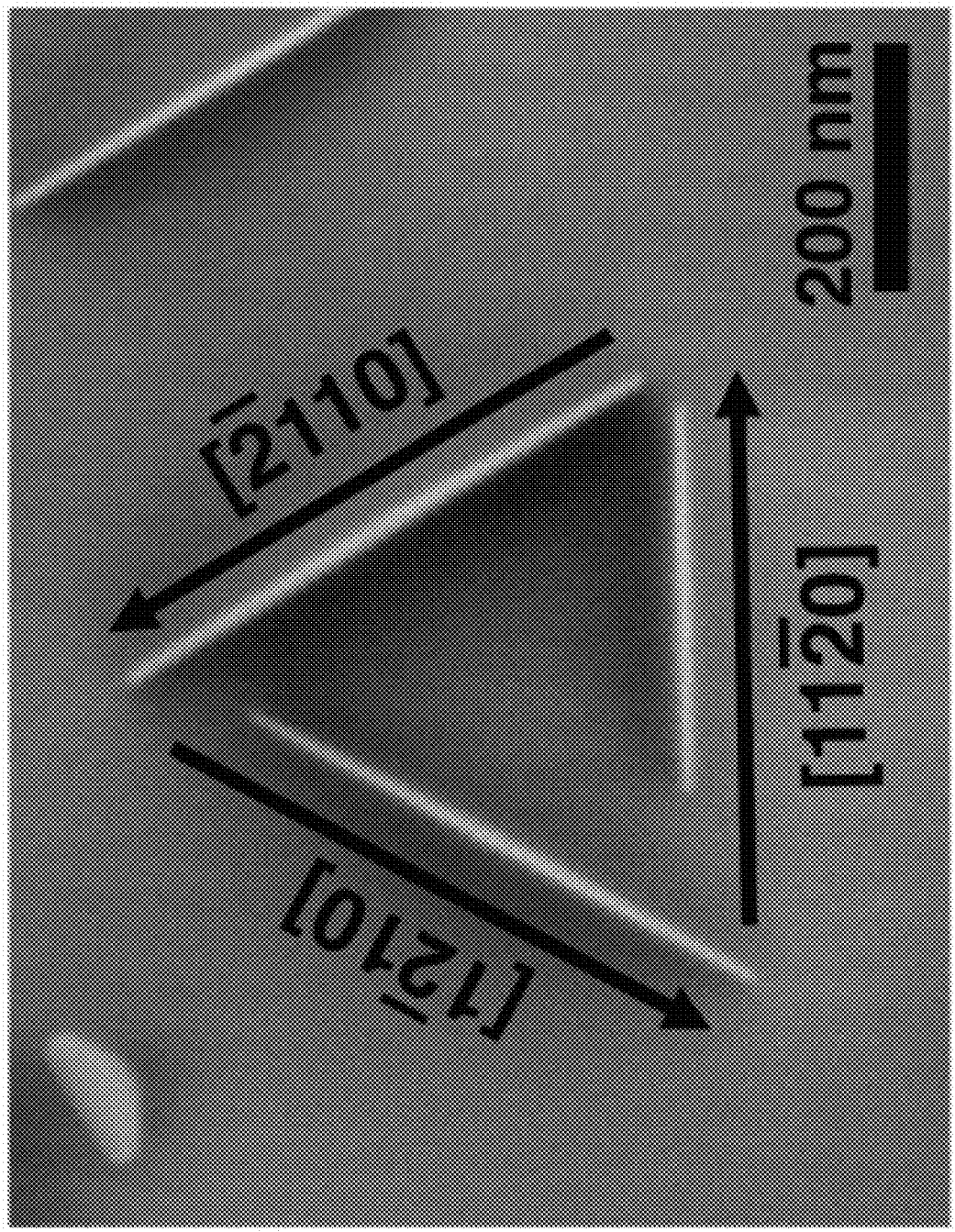
FIG. 17 depicts an SEM image of vertical fins deposited on 6H—SiC, which are identified to grow along the 6H—SiC [1120], [2110], and [1210] directions.

The vertical to horizontal morphology evolution is independent of the substrate. This becomes apparent when comparing the morphology evolution of MoS$_2$ grown on different substrates, including silicon dioxide on silicon (SiO$_2$/Si), sapphire (Al$_2$O$_3$), and epitaxial graphene (EG) (FIG. 16). Therefore, the changes in the surface/edge energies are minor and morphology evolution is primarily a function of a MoO$_x$:S$_2$ partial pressure ratio gradient. PV deposition of MoS$_2$ on 6H—SiC and Al$_2$O$_3$ yields fins that only grow in specific orientations, while fins deposited on SiO$_2$/Si and EG are randomly oriented, indicating epitaxial growth of fins can occur on single crystalline substrates. Considering the original wafer orientation of 6H—SiC, fins are identified to grow along the hexagonal symmetry related directions: [1120], [2110], and 1210 (FIG. 17). Further inspection of the fin morphology by imaging a cleaved cross-sectional sample under SEM reveals a faceted isosceles triangular morphology (FIG. 13E). The faceted morphology of fins indicates that the morphology is determined by the growth kinetics of crystallographic faces as related to the minimization of surface energy during growth. Raman spectroscopy revealed that lateral domains are 2H—MoS$_2$; on the other hand, vertical fins are determined to be a mixture of 2H—MoS$_2$ and monoclinic MoO$_2$ (FIG. 13F). The presence of MoO$_2$ and MoS$_2$ in the fins demonstrates that multiple mechanisms are responsible for the formation of vertical fins: 1) nucleation and growth of MoO$_2$ fins followed by sulfurization to form partially sulfurized MoO$_2$ fins; and 2) a growth competition between MoO$_2$ and MoS$_2$ leading to a multi-component fin.

Figure 18:
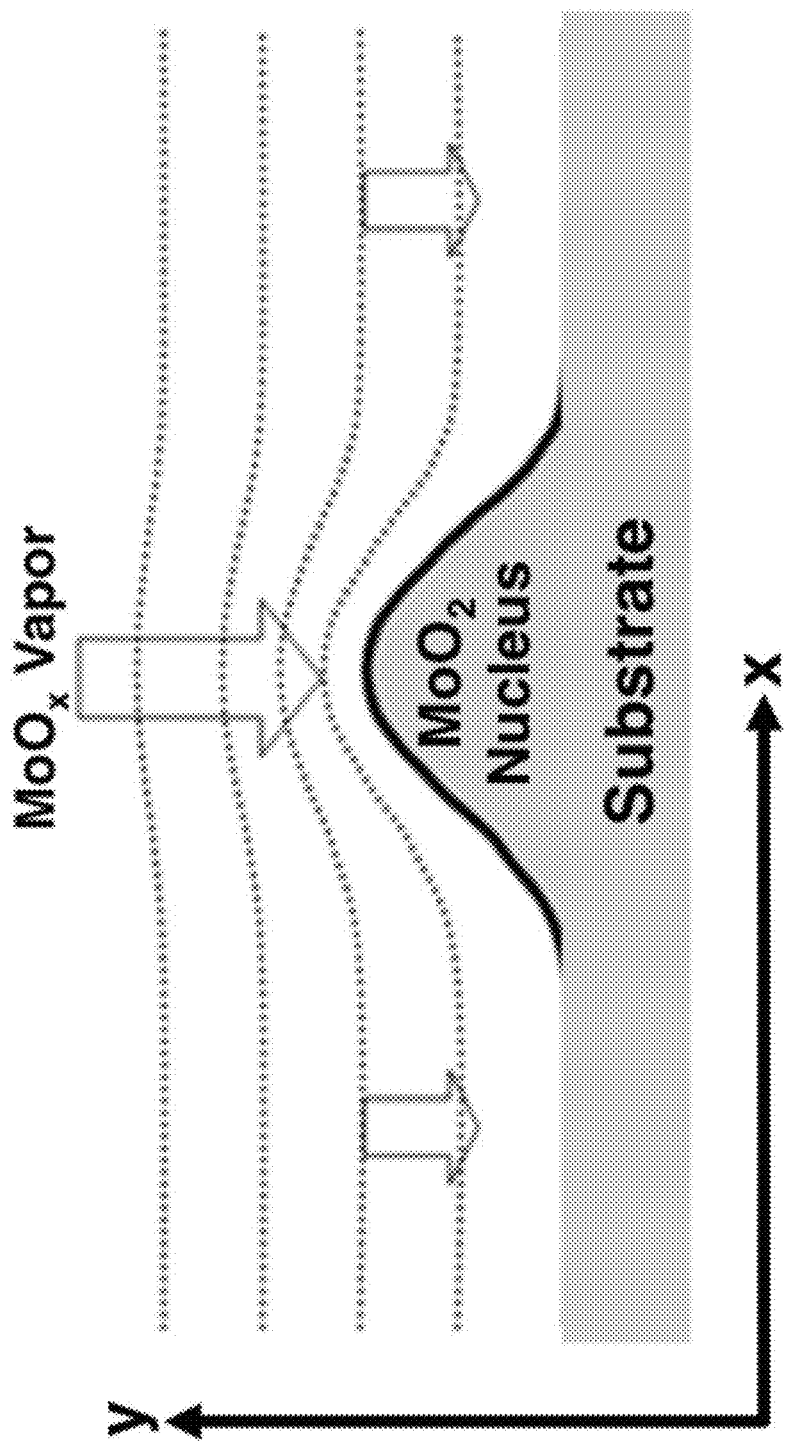
FIG. 18 depicts a schematic of a $MoO_2$ nucleus with a self-amplifying $MoO_x$ partial pressure gradient normal to the substrate, which creates an additional driving force for growth of the fins normal to the substrate.

To elucidate the fin growth mechanism, sulfur was eliminated during synthesis to compare the morphology and structure to those resulting from the co-flow process. Even without the presence of S$_2$, the aligned fin morphology is still achieved close to the MoO$_3$ source (FIG. 14A); however, the formation of lateral domains is precluded. Raman spectroscopy (FIG. 14B) (Lafuente et al., 2015, The Power of Databases: The RRUFF Project. In: Highlights in Mineralogical Crystallography, Berlin, Germany, 1-30) confirms the composition of the fins as monoclinic MoO$_2$, and spatially mapping the intensity of the Raman shift at 497 cm$^{-1}$ (FIG. 14C) demonstrates that MoO$_2$ is limited to the fin morphology. This demonstrates that the MoO$_2$/6HSiC interfacial energy is much higher than the MoO$_2$/vapor interfacial energy, resulting in an island-like (Volmer-Weber) growth mode (Volmer et al. 1926, Phys. Chem, 119: 277-301). It was also noted that the MoO$_3$ concentration gradient normal to the substrate results in a self-amplifying concentration gradient (FIG. 18) described by the Mullins-Sekerka instability and growth (Mullins et al, 1963, Appl. Phys, 34: 323), which also promotes vertical growth.

Figure 19:
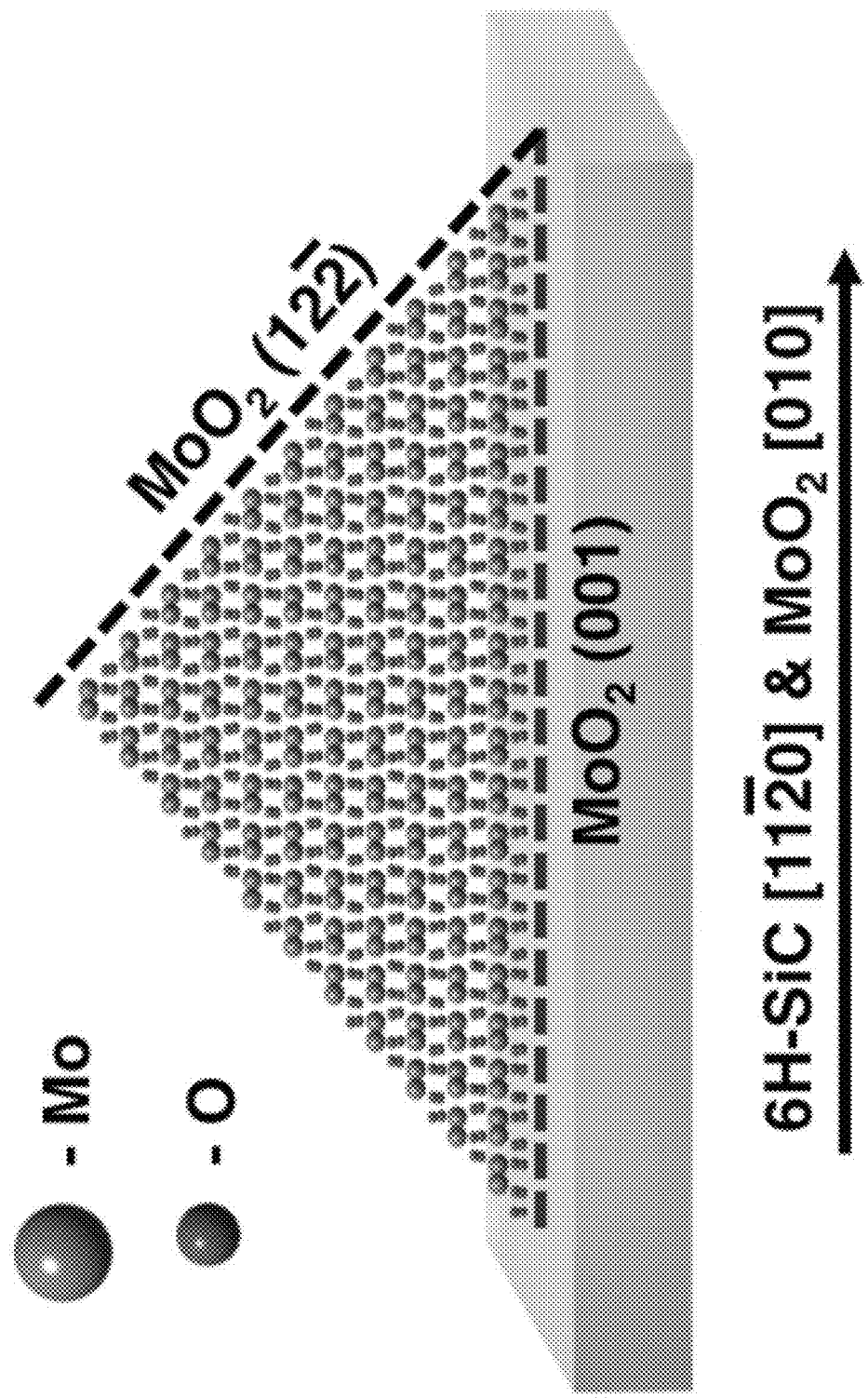
FIG. 19 illustrates a schematic of the atomic projection of a $MoO_2$ fin sidewall. The angle between the (001) plane and the (112) plane is 40.8°.
Figure 21:
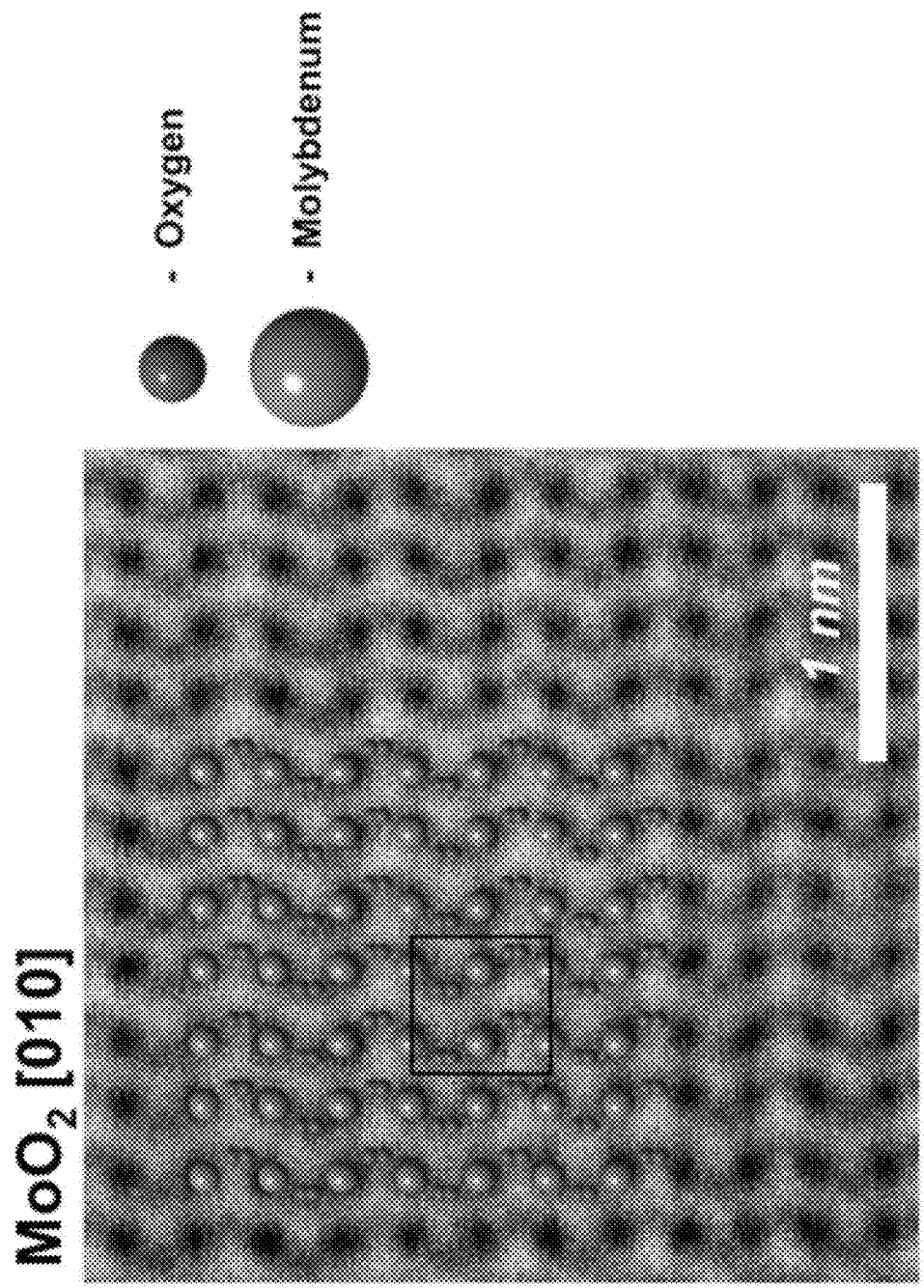
FIG. 21 depicts an ABF-STEM image of the center of a $MoO_2$ fin cross-section. The atomic projection of $MoO_2$ has been overlaid as viewed down the [010] zone axis, confirming the orientation of $MoO_2$ fins. A unit cell of $MoO_2$ is outlined by a black rectangle.

Transmission electron microscopy (TEM) confirms the vertical morphology and reveals the single crystalline nature of the MoO$_2$ fins. Utilizing high-resolution scanning transmission electron microscopy (STEM) with a high angle annular dark field (HAADF) detector, one can identify the epitaxial growth of MoO$_2$ on 6H—SiC (0001) (FIG. 14D through FIG. 14E), and verify the Mo-spacing in the fins matches that of MoO$_2$ along the [001] zone axis (FIG. 14F). STEM imaging of a MoO$_2$ fin, collected with an annular bright field detector, reveals the position of oxygen atoms and overlaying the atomic projection of MoO$_2$ as viewed down the [001] axis further confirms the composition and structure of fins (FIG. 19). From identification of the zone axis, the basal plane and sidewalls of MoO$_2$ fins can be identified as (010) and (100), respectively. The observed isosceles triangular morphology of the (100) plane can be further explained by the (122) cleavage plane which sits 40.8° above the basal plane (FIG. 20), which is good agreement with the experimentally measured angle of vertical fins, the MoO$_2$ fin morphology is schematically illustrated in FIG. 14G.

The orientation of MoO$_2$ fins on 6H—SiC (and other crystalline substrates) is heavily influenced by the strain at the MoO$_2$/substrate interface. Constraining the MoO$_2$ [001] axis to be parallel to the 6H—SiC [1120] direction, the structures of 0-terminated MoO$_2$ (010) and Si-terminated 6H—SiC (0001) can be directly overlaid. This leads to the formation of a Moiré pattern between the 0 from MoO$_2$ and Si from 6H—SiC (FIG. 14H). As the MoO$_2$ (010) plane is rotated with respect to the 6H—SiC [0001] axis, the local strain is increased until a maximum is reached when the MoO$_2$ [001] axis is parallel to the 6HSiC [1010] direction (30° from [1120]). Further rotation of the MoO$_2$ (010) reduces local strain until the MoO$_2$ [001] axis is parallel to 6H—SiC [2110] (60° from [1120]), reforming the original Moiré pattern (FIG. 20). This demonstrates that growth of MoO$_2$ parallel to the 6H—SiC [1120], [2110], and 1210 directions can minimize strain energy between the MoO$_2$ (010) and 6H—SiC (0001) surfaces. While total strain can differ due to various relaxation mechanisms, this result demonstrates the origin of oriented growth of MoO$_2$ fins on single crystalline 6H—SiC and Al$_2$O$_3$ substrates.

Elimination of sulfur during synthesis provides strong demonstrates that vertical domains formed during co-flow of sulfur and MoO$_3$ results from nucleation and growth of MoO$_2$ fins followed by sulfurization into MoS$_2$. From kinetic theory, the partial pressure (Pi) and molecular mass (Mi) of a gaseous species i, and temperature (T) to the impingement rate (Φi) of the species i (Equation 4) are directly related (M. Ohring, Materials Science of Thin Films: Deposition & Structure, 2nd ed. Academic Press, San Diego, Calif. 2002):

$$\phi_i = \frac{1}{\sqrt{2\pi kT}} \left( \frac{P_i}{\sqrt{M_i}} \right) \qquad \text{Equation (4)}$$

where k is Boltzman's constant. For the case of a high P$_{MoOx}$:P$_{S2}$ ratio, the impingement rate of MoO$_x$ is much greater than the impingement rate of S$_2$ (ΦMoO$_x$>>Φ$_{S2}$). It has been demonstrated that sulfur readily sulfurizes $MoO_x$ into $MoS_2$ (Wang et al., 2013, J. Am. Chem. Soc, 135: 5304-5307), therefore the $MoO_2$ growth rate ($r_{MoO2}$) as a function of difference between $\Phi_{MoOx}$ and $\Phi_{S2}$, i.e., $r_{MoO2} \approx \Phi_{MoOx} - \Phi_{S2}$ can be determined (Ohring, Materials Science of Thin Films: Deposition & Structure, 2nd ed. Academic Press, San Diego, Calif. 2002). Thus, the growth rate of $MoS_2$ is determined by the impingement of sulfur onto the substrate ($r_{MoS2}$) because $S_2$ is the rate limiting species when $P_{MoOx} \gg P_{S2}$.

Figure 22:
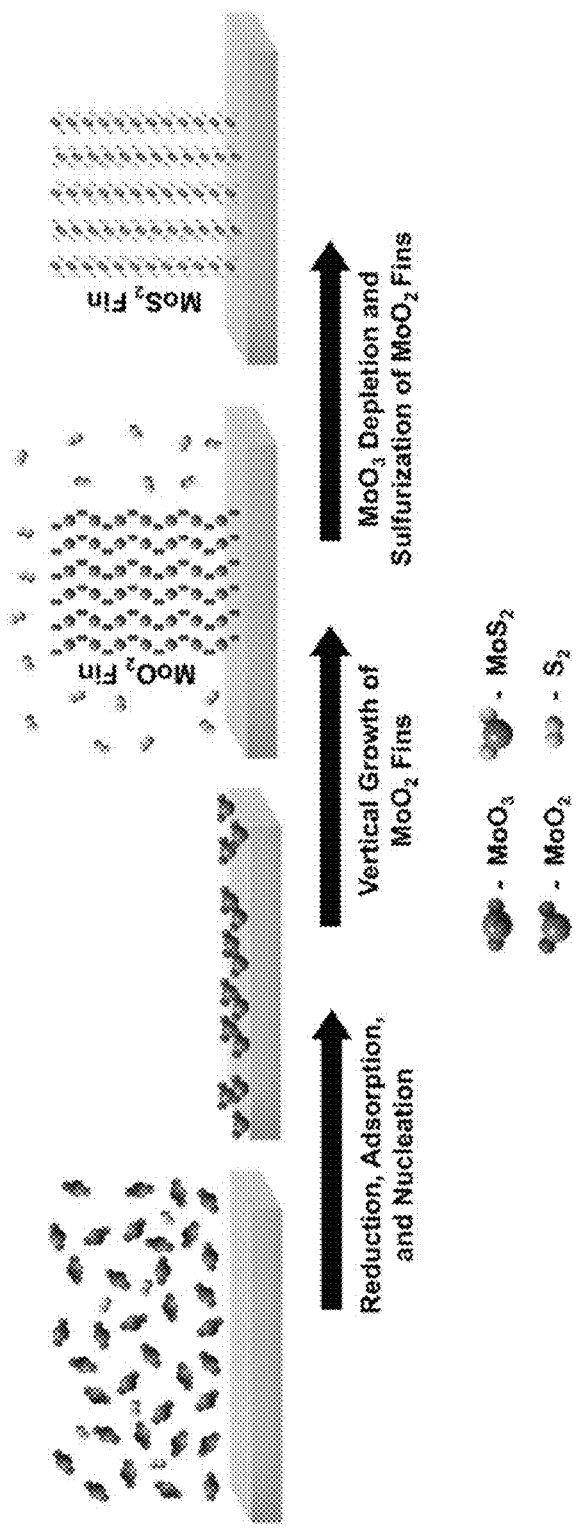
FIG. 22 depicts a schematic of the growth mechanism for $MoS_2$ when the partial pressure ratio of $MoO_x:S_2$ is very large (molybdenum oxide rich atmosphere).
Figure 23:
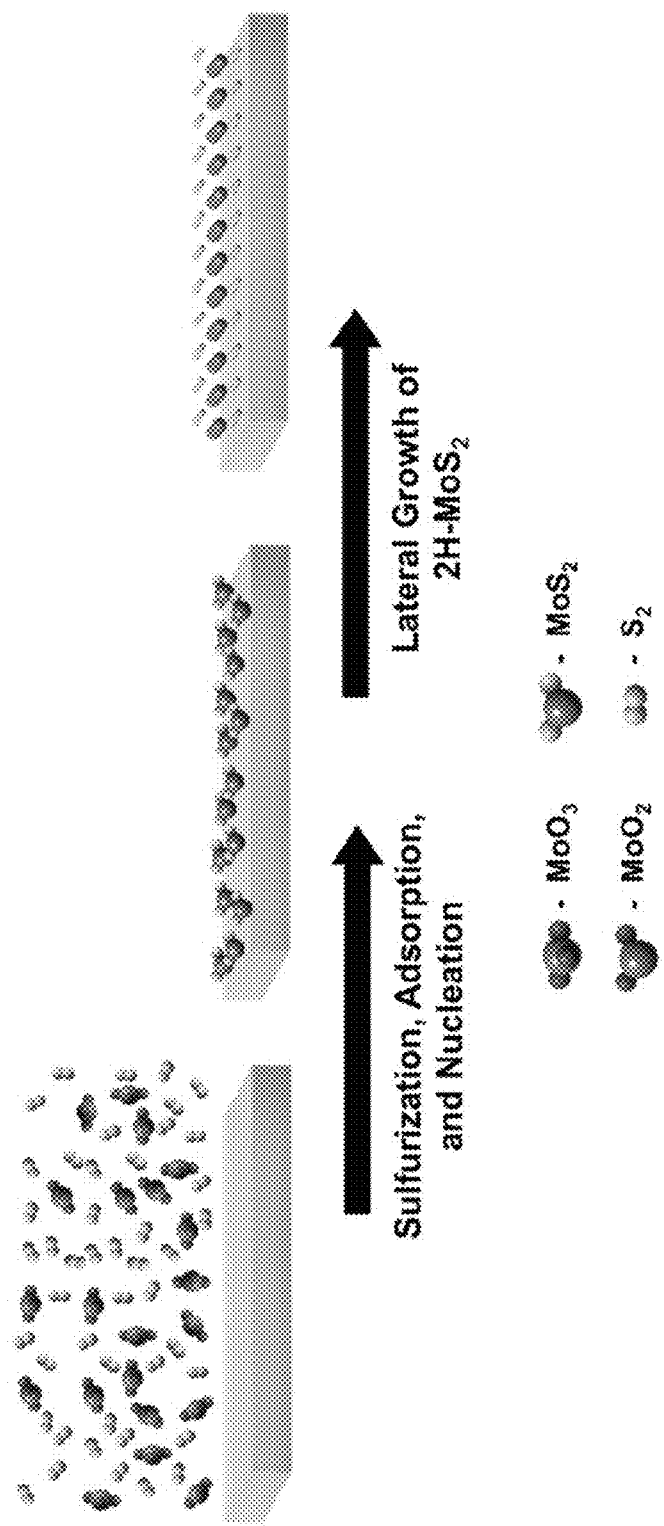
FIG. 23 depicts a schematic of the growth mechanism for $MoS_2$ when the partial pressure ratio of $MoO_x:S_2$ is very low (sulfur rich atmosphere).

In regions where the $P_{MoOx} \gg P_{S2}$, the growth rate of $MoO_2$ is much greater than $MoS_2$ ($r_{MoO2} \gg r_{MoS2}$). Consequently, the rate of nucleation and growth of $MoO_2$ fins is greater than its sulfurization rate, precluding lateral $MoS_2$; experimentally this growth regime is observed near the $MoO_3$ source as shown in FIG. 13B, and schematically it is illustrated in FIG. 22. Reducing $P_{MoOx}$ to an intermediate $MoO_x:S_2$ partial pressure ratio leads to reduction of $r_{MoO2}$, while $r_{MoS2}$ remains unchanged (sulfur limited). As $r_{MoS2}$ is reduced, there is a transition to a mixture of $MoO_2$ fins and $MoS_2$ lateral domains (FIG. 13C). Further reduction of $P_{MoOx}$ below some critical value ultimately reduces $r_{MoO2}$ to a point where $MoO_2$ nuclei cannot reach a critical radius for stabilization prior to sulfurization. In the regime where $P_{MoOx} \ll PS_2$, the rate limiting species becomes $MoO_x$, resulting in complete sulfurization of $MoO_x$ species. Experimentally this growth regime is observed farthest from the $MoO_3$ source (FIG. 13E), and is schematically it is illustrated in FIG. 23. Examining fins at various points during sulfurization (FIG. 15A through FIG. 15D) reveals the $MoO_2$ transformation into $MoS_2$ begins at the $MoO_2$ sidewalls, resulting in a core-shell $MoO_2/MoS_2$ fin (FIG. 15B). Evident from the minimal transformation of the $MoO_2$ fin sidewall into $MoS_2$ (0001), sulfurization of the $MoO_2$ sidewall kinetically limits diffusion of sulfur through the newly formed $MoS_2$ (0001) plane (Wang et a., 2013, J. Am. Chem. Soc, 135: 5304-5307). Only considering sulfur diffusion from the surface-inward, it is expected that sulfurization of $MoO_2$ fins would be self-limiting. However, continued sulfurization reveals that the oxide-to-sulfide transformation rate is greatest at the $MoO_2$/substrate interface (FIG. 15C). This is due to strain, disorder, and defects that ultimately increase the diffusion mobility of sulfur at the $MoO_2$/substrate interface, which in turn provides a pathway for sulfur diffusion and oxide-to-sulfide transformation. Furthermore, the van der Waals gap between newly formed layers of $MoS_2$ creates a vertical pathway for sulfur diffusion, leading to a $MoS_2/MoO_2$ transformation front (FIG. 15C) that enables complete transformation of $MoO_2$ into $MoS_2$ (FIG. 15D). The sulfurization process and transformation of $MoO_2$ fins into $MoS_2$ is schematically illustrated in FIG. 15E.

$MoS_2$ layers within the fully sulfurized fin (FIG. 15D) share a common [0001] axis, however, $MoS_2$ layers are observed to take various orientations (FIG. 24). It is demonstrated that the different orientations are related to differences in the rate of sulfurization of $MoO_2$ at the surface, interface, and bulk. It is noted that $MoS_2$ (31.63 cm$^3$ mol$^{-1}$) has a molar volume 60% larger than $MoO_2$ (19.77 cm$^3$ mol$^{-1}$), and complete sulfurization of the $MoO_2$ fin results in a 60% increase in volume. However, the volume of fins typically decreases after sulfurization demonstrating that the transformation of $MoO_2$ into $MoS_2$ is an inefficient process whereby Mo, $MoO_x$, and O desorb from the fin during sulfurization.

The growth mechanism of vertical $MoS_2$ fins and lateral $MoS_2$ domains synthesized via PV has been investigated by deliberate introduction of a $MoO_x$ partial pressure gradient. The $MoO_x:S_2$ partial pressure ratio and its distribution are found to be the primary parameters controlling the morphology of $MoS_2$ between lateral domains and vertical fins when metal-oxide precursors are utilized. Furthermore, through removal of the sulfur precursor during synthesis it has been determined that $MoS_2$ fins are formed through a two-step process: $MoO_2$ fin seeding, followed by sulfurization. In the case where synthesis occurs on crystalline substrates, strain minimization at the $MoO_2$ (010)/6H—SiC (0001) interface leads to preferable orientation of $MoO_2$ [001] to 6H—SiC [1120], [2110], and 1210 directions. Subsequently, it has been demonstrated that sulfurization of $MoO_2$ fins is not simply a "surface-inward" transformation, but rather occurs primarily at the interface between $MoO_2$ fins and the substrate and migrates upward as $MoS_2/MoO_2$ transformation fronts. The work presented here clearly demonstrates that tuning the metal-oxide to chalcogenide precursor partial pressures not only controls the lateral morphology of 2D materials, but is key to realizing vertically oriented 2D structures.

The disclosures of each and every patent, patent application, and publication cited herein are hereby incorporated herein by reference in their entirety. While this invention has been disclosed with reference to specific embodiments, it is apparent that other embodiments and variations of this invention may be devised by others skilled in the art without departing from the true spirit and scope of the invention. The appended claims are intended to be construed to include all such embodiments and equivalent variations.

What is claimed is:

1. Planar structures comprising at least one planar structure on a substrate, made using a method of fabricating planar structures from a first material powder and a second material powder, wherein the method comprises the steps of:
   placing a substrate on a first crucible in a furnace;
   placing an amount of the first material powder in the first crucible underneath the substrate;
   placing an amount of the second material powder in a second crucible upstream from the first crucible;
   introducing a flow of gas into the furnace and maintaining a furnace pressure of between 1 and 1000 torr;
   heating the furnace to at least one temperature between 500 and 1000° C. and holding for at least one period of time between 5 and 120 minutes; and
   equilibrating the furnace temperature to room temperature;
   thereby generating at least one planar structure on the substrate with the second material powder annealed to the at least one planar structure on the substrate;
   wherein the at least one planar structure has a triangular morphology comprising multilayered vertically oriented planar molybdenum chalcogenide domains which are angled relative to the plane of the surface of the substrate at about 90°, and
   wherein the at least one planar structure has a triangular morphology from the surface of the substrate.

2. The planar structures of claim 1, wherein the substrate is selected from the group consisting of: sapphire, silicon, silicon carbide, silicon dioxide, graphene, graphite, non-alkali glass, poly-silicon carbide, and poly-silicon.

3. The planar structures of claim 1, wherein the planar structures have a thickness of less than 20 layers.

4. The planar structures of claim 3, wherein each layer is less than 1 nm thick.

5. The planar structures of claim 3, wherein the layers are separated by van der Waals gaps.

6. The planar structures of claim 1, wherein the method further comprises the step of adding at least one additional material to the planar structures to form planar heterostructures.

7. The planar structures of claim 1, wherein the planar structures have a horizontal length of at least 0.1 µm.

8. The planar structures of claim 1, wherein the multilayered vertically oriented planar molybdenum chalcogenide domains comprise $MoS_2$.

9. The planar structures of claim 1, wherein the planar structures have a vertical height of less than 20 nm.

10. The planar structure of claim 1, wherein the multilayered vertically oriented planar molybdenum chalcogenide domains are multilayered vertically oriented planar $MoS_2$ domains.

11. Planar structures comprising at least one planar structure on a substrate, wherein the at least one planar structures comprises multilayered vertically oriented planar molybdenum chalcogenide domains which are angled relative to the plane of the surface of the substrate at about 90°, and wherein the multilayered vertically oriented planar molybdenum chalcogenide domains have a triangular morphology from the surface of the substrate.

12. The planar structures of claim 11, wherein the substrate is selected from the group consisting of: sapphire, silicon, silicon carbide, silicon dioxide, graphene, graphite, non-alkali glass, poly-silicon carbide, and poly-silicon.

13. The planar structures of claim 11, wherein the planar structures have a horizontal length of at least 0.1 µm.

14. The planar structures of claim 11, wherein the planar structures have a vertical height of less than 20 nm.

15. The planar structures of claim 11, wherein the planar structures have a thickness of less than 20 layers.

* * * * *

UNITED STATES PATENT AND TRADEMARK OFFICE
CERTIFICATE OF CORRECTION

PATENT NO. : 11,024,710 B2
APPLICATION NO. : 15/712561
DATED : June 1, 2021
INVENTOR(S) : Joshua Alexander Robinson and Rafael Vila Page 1 of 1

It is certified that error appears in the above-identified patent and that said Letters Patent is hereby corrected as shown below:

In the Specification

Column 1, Lines 10-14 should read as follows:
STATEMENT REGARDING FEDERALLY SPONSORED RESEARCH OR DEVELOPMENT
This invention was made with government support under Grant No. DMR1453924 awarded by the National Science Foundation and under Grant No. HR0011-13-3-0002 awarded by the Defense Advanced Research Projects Agency. The Government has certain rights in the invention.

Signed and Sealed this
Fifteenth Day of June, 2021

Drew Hirshfeld
*Performing the Functions and Duties of the*
*Under Secretary of Commerce for Intellectual Property and*
*Director of the United States Patent and Trademark Office*